(12) United States Patent
Boscher et al.

(10) Patent No.: US 12,110,418 B2
(45) Date of Patent: Oct. 8, 2024

(54) CONDUCTIVE FILM OF FUSED PORPHYRINS POLYMER AND METHOD OF FORMING A COATED SUBSTRATE

(71) Applicant: LUXEMBOURG INSTITUTE OF SCIENCE AND TECHNOLOGY (LIST), Esch-sur-Alzette (LU)

(72) Inventors: Nicolas Boscher, Audun le Tiche (FR); Giuseppe Bengasi, Esch-sur-Alzette (LU); Kamal Baba, Luxembourg (LU)

(73) Assignee: LUXEMBOURG INSTITUTE OF SCIENCE AND TECHNOLOGY (LIST), Esch-sur-Alzette (LU)

( * ) Notice: Subject to any disclaimer, the term of this patent is extended or adjusted under 35 U.S.C. 154(b) by 656 days.

(21) Appl. No.: 17/289,322

(22) PCT Filed: Nov. 12, 2019

(86) PCT No.: PCT/EP2019/080991
§ 371 (c)(1),
(2) Date: Apr. 28, 2021

(87) PCT Pub. No.: WO2020/099385
PCT Pub. Date: May 22, 2020

(65) Prior Publication Data
US 2022/0010146 A1 Jan. 13, 2022

(30) Foreign Application Priority Data

Nov. 13, 2018 (LU) .......................... 100988

(51) Int. Cl.
| | |
|---|---|
| C09D 5/24 | (2006.01) |
| B05D 1/00 | (2006.01) |
| C09D 165/00 | (2006.01) |
| H01B 1/12 | (2006.01) |
| H10K 85/10 | (2023.01) |

(52) U.S. Cl.
CPC ................. *C09D 5/24* (2013.01); *B05D 1/60* (2013.01); *C09D 165/00* (2013.01); *H01B 1/128* (2013.01); *H10K 85/111* (2023.02)

(58) Field of Classification Search
CPC .......... C09D 5/24; C09D 165/00; B05D 1/60; H01B 1/128; H01L 51/0035
USPC ........................................ 428/446
See application file for complete search history.

(56) References Cited

U.S. PATENT DOCUMENTS 5,252,698 A * 10/1993 Bhardwaj ............... H01B 1/12
540/203
2003/0187252 A1* 10/2003 Osuka ................. C07D 487/22
534/11

FOREIGN PATENT DOCUMENTS

EP 1318151 A1 6/2003

OTHER PUBLICATIONS

Tsuda A et al: "Fully conjugal porphyrin tapes with electronic absorption bands that reach into infrared", Science, AAAS, American Assoc.for the Advancement of Science, US, vol. 293, Jul. 6, 2001, pp. 79-82, XP002313970, ISSN: 0036-8075, DOI: 10.1126/SCIENCE.1059552 Scheme 1, Formulae 18 and 18.
Kamal Baba et al: "Conductive Directly Fused Poly (Porphyrin) Coatings by Oxidative Chemical Vapour Deposition—From Single- to Triple-Fused: Conductive Directly Fused Poly (Porphyrin) Coatings by Oxidative Chemical Vapour Deposition—From Single- to Triple-Fused", European Journal of Organic Chemistry, vol. 2019, No. 13, Apr. 9, 2019, pp. 2368-2375, XP055609416, DE ISSN: 1434-193X, DOI: 10.1002/ejoc.201900045.
Giuseppe Bengasi et al: "Conductive Fused Porphyrin Tapes on Sensitive Substrates by a Chemical Vapor Deposition Approach", Angewandte Chemie, International Edition, vol. 58, No. 7, Feb. 11, 2019, pp. 2103-2108, XP055609430, DE ISSN: 1433-7851, DOI: 10.1002/anie.201814034.
International Search Report for PCT/EP2019/080991 mailed Feb. 14, 2020.
Written Opinion for PCT/EP2019/080991 mailed Feb. 14, 2020.

* cited by examiner

*Primary Examiner* — Hui H Chin
(74) *Attorney, Agent, or Firm* — Sandberg Phoenix & von Gontard, P.C.

(57) ABSTRACT

A conductive coating comprising polymers of meso-meso, β-β doubly linked fused and/or meso-β, β-meso doubly linked fused and/or meso-meso, β-β, β-βtriply linked fused (poly)porphyrins. A method for forming on a substrate a thin conductive coating of polymers of meso-meso, β-β doubly and/or meso-β, β-meso doubly and/or meso- meso, β-β, β-β triply linked fused (poly)porphyrins, the method comprising the steps of providing a substrate in a vacuum chamber, performing on the substrate an oxidative chemical vapour deposition reaction with an oxidant and at least one porphyrin monomer.

18 Claims, 17 Drawing Sheets

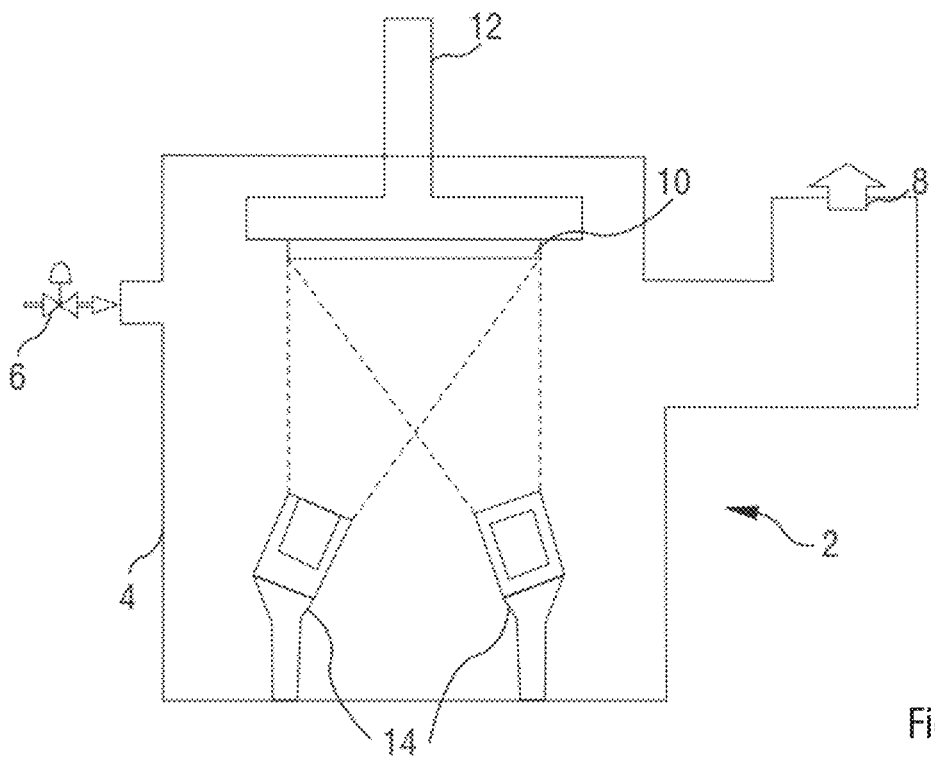
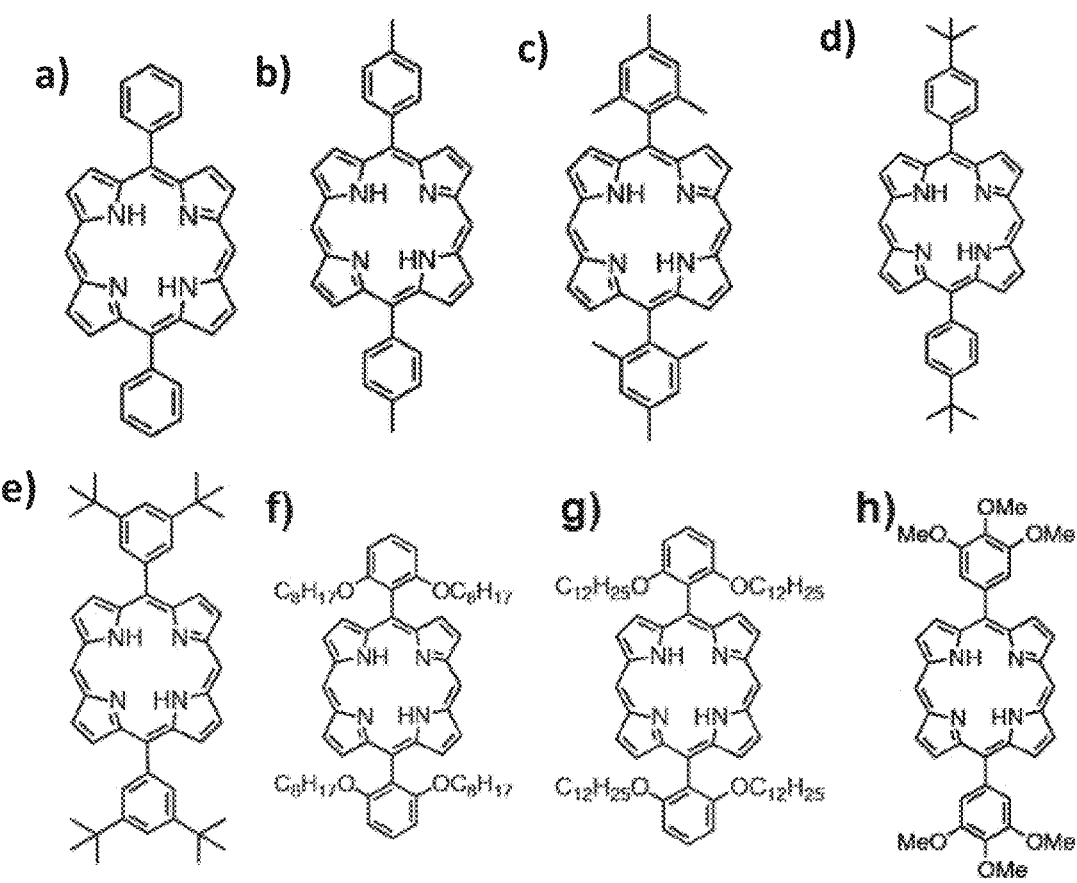
Fig. 2 (cont'd)

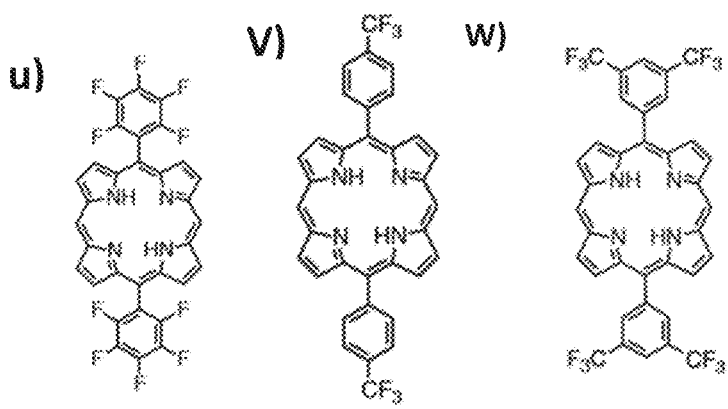
Fig. 2
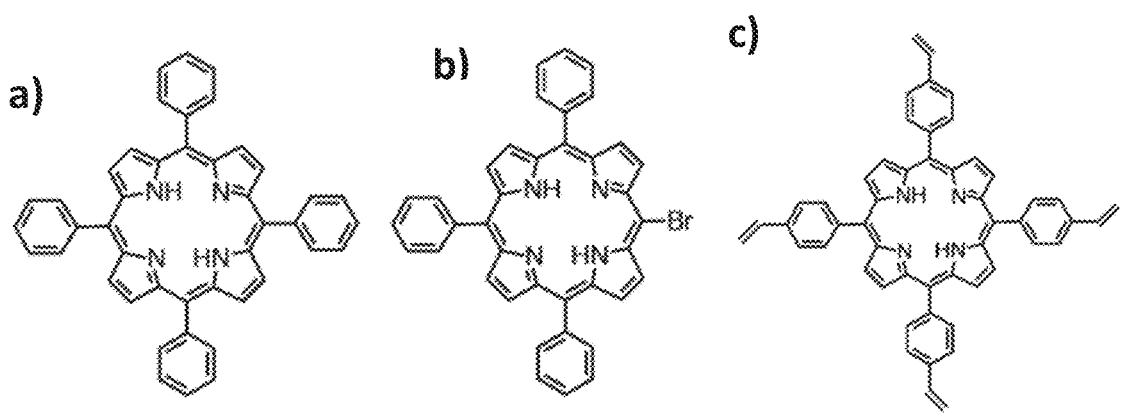
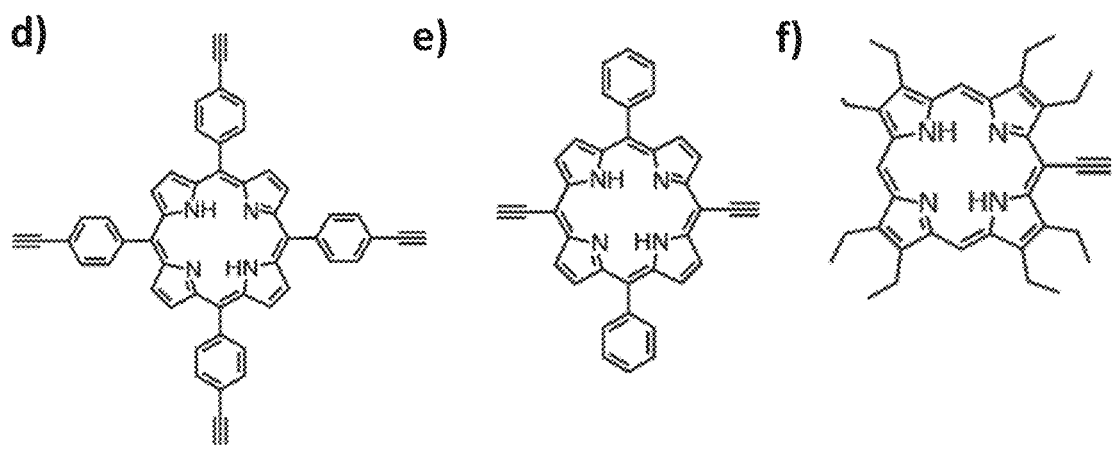
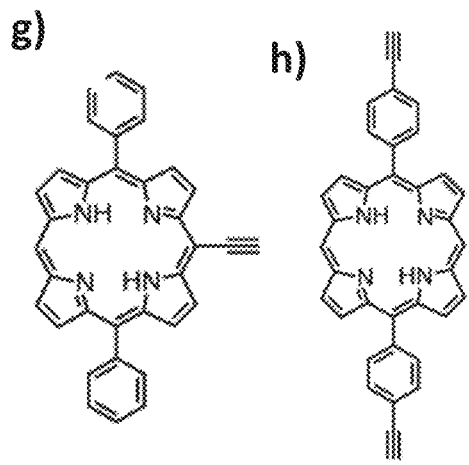
Fig. 3

CONDUCTIVE FILM OF FUSED PORPHYRINS POLYMER AND METHOD OF FORMING A COATED SUBSTRATE

CROSS-REFERENCE TO RELATED APPLICATIONS

The present invention is the US national stage under 35 U.S.C. § 371 of International Application No. PCT/EP2019/080991 which was filed on Nov. 12, 2019, and which claims the priority of application LU 100988 filed on Nov. 13, 2018, the content of which (text, drawings and claims) are incorporated here by reference in its entirety.

FIELD

The invention is directed to a conductive coating of directly fused poly(porphyrins) and to a method for synthetizing a coating of directly fused poly(porphyrins).

BACKGROUND

Conjugated porphyrin polymers, including directly fused porphyrin polymers, own fascinating electronic and optoelectronic properties that may yield electronic noses or organic solar cells with enhanced performances. However, the two main synthesis routes towards conjugated poly (porphyrins), (i) solution-phase oxidative polymerisation using a suitable oxidant or (ii) electrodeposition, are a major drawback to the study and integration of conjugated poly (porphyrins) into devices. Indeed, the poor solubility of the porphyrin monomers, oligomers and polymers required the introduction of bulky pendant groups to form conjugated poly(porphyrins) in which the tetrapyrrole porphine nuclei responsible for the targeted properties end-up diluted.

Prior art patent document published EP 1 318 151 A1 discloses a method for synthesizing directly meso-meso linear porphyrin polymers and fused porphyrin oligomers by linking two β-β positions directly through oxidation of meso-meso linked porphyrin arrays. The patent does not disclose any polymer of porphyrin being directly fused with at least two bonds neither a method for directly synthetizing a coating of polymers of directly fused porphyrins with at least two bonds. The conjugated poly(porphyrins) are poorly soluble, in the form of bulk and unmeltable resulting in a complex processability that make their technological application complicated. The method is limited in that it does not allow to obtain a thin film of fused porphyrin polymers.

SUMMARY

The invention has for technical problem to overcome at least one drawback of the mentioned prior art. More particularly the invention has for technical problem to provide a conductive film of directly fused poly(porphyrins) and to provide a simple method for directly synthetizing a conductive thin film of directly fused poly(porphyrins).

The invention is directed to a conductive coating comprising polymers of meso-meso, β-β doubly linked fused and/or meso-β, β-meso doubly linked fused and/or meso-meso, β-β, β-β triply linked fused (poly)porphyrins, the polymers being represented as:

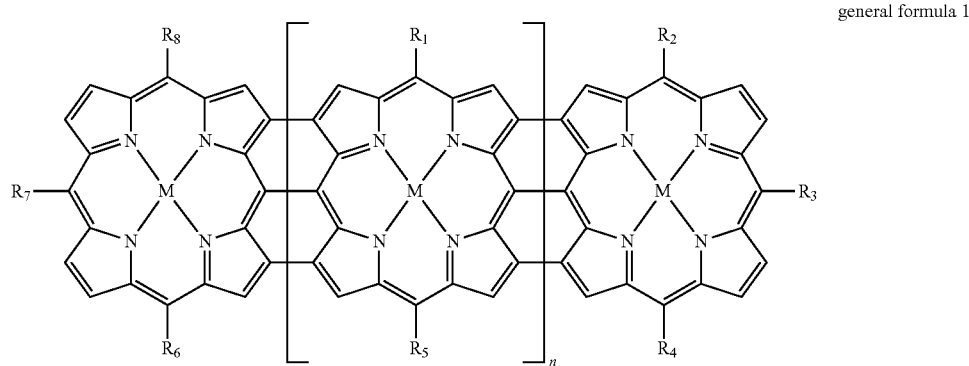

general formula 1 wherein $R_1$-$R_8$ are independently selected from the group: hydrogen, halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group;

wherein M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi, wherein the polymers of general formula 1 comprises n monomers, n is superior to 2 and the monomers being the same or different.

According to an exemplary embodiment, n is superior to 50, in various instances superior to 100.

According to an exemplary embodiment, $R_1$-$R_8$ are independently selected from the group: H, phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl, wherein M is 2H or one metal atoms selected from the group of: Cr, Mn, Fe, Co, Ni, Cu, Zn, Ga, Pd, In, Pt.

The invention is also directed to a method for forming on a substrate a thin conductive coating of polymers of meso-meso, β-β doubly and/or meso-β, β-meso doubly and/or meso-meso, β-β, β-β triply linked fused (poly)porphyrins, the method comprising the steps of:
providing a substrate in a vacuum chamber,
performing on the substrate an oxidative chemical vapour deposition reaction with an oxidant and at least one porphyrin monomer of general formula 2:

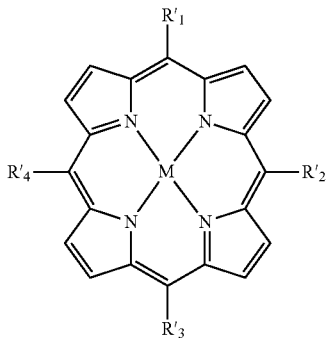

wherein at least two of $R'_1$-$R'_4$ are H, the others being respectively selected independently from the group consisting of: halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group, wherein M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi.

According to an exemplary embodiment, the step of performing on the substrate an oxidative chemical vapour deposition reaction with an oxidant and at least one porphyrin monomer of formula 2 comprises sublimating separately the oxidant and the at least one porphyrin monomer in the vacuum chamber to form gaseous phases respectively and delivering the gaseous phases on the substrate.

According to an exemplary embodiment, the step performing on the substrate an oxidative chemical vapour deposition reaction with an oxidant and at least one porphyrin monomer of general formula 2 is further performing with at least one crosslinking monomer being a mono-meso-substituted porphyrin monomer and/or porphine monomer.

According to an exemplary embodiment, at least two of $R'_1$-$R'_4$ are H, the others being respectively selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl.

According to an exemplary embodiment, $R'_1$ and $R'_3$ are H and $R'_2$ and $R'_4$ are both selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl.

According to an exemplary embodiment, the oxidant is selected from the group consisting of: $FeCl_3$, $CuCl_2$ or $Cu(ClO_4)_2$.

According to an exemplary embodiment, the step of performing the oxidative chemical vapour deposition reaction is performed at a pressure comprised between $10^{-4}$ mbar to $10^{-2}$ mbar.

According to an exemplary embodiment, the oxidant is sublimated at a temperature comprised between 100° C. and 350° C.

According to an exemplary embodiment, the at least one porphyrin monomer of general formula 2 is sublimated at a temperature comprised between 200° C. and 300° C.

According to an exemplary embodiment, the at least one porphyrin monomer of general formula 2 is a metalized 5,15-(diphenyl)porphyrin (MDPP), wherein M is one metal atoms selected from the group of: Cr, Mn, Fe, Co, Ni, Cu, Zn, Ga, Pd, In, Pt.

According to an exemplary embodiment, the oxidant is $FeCl_3$, sublimated between 100° C. and 200° C., in various instances between 130° C. and 180° C.

According to an exemplary embodiment, the substrate is a polymer, in various instances polyethylene naphthalate or a paper, for example printer paper sheet.

According to an exemplary embodiment, the substrate is an insulating substrate selecting from the group of: glass, polymer, in various instances polyethylene naphthalate or paper, for example printer paper sheet.

The invention is also directed to a device comprising a substrate and a thin conductive coating of directly fused (poly)porphyrins, wherein the thin conductive coating is in accordance with the invention.

The invention is particularly interesting in that the fused porphyrins coating is electrically conductive. The method of the invention allows the simultaneous synthesis, deposition and p-doping effect of directly fused poly(porphyrins) thin films. The selected oxidative Chemical Vapour Deposition (oCVD) approach does not require any specific functionalization of the porphyrin monomer and allow the use of commercially and available porphyrins. The method is particularly interesting for flexible and organic electronic applications. The oCVD allows the coating on sensitive and/or flexible substrates and allow patterning for device fabrication.

Particularly, the oCVD of polymers allows to circumvent the problems related to the poor solubility of polymers and monomers since no solvents are required. With the method of the invention, neither the monomers nor the formed polymers need to be soluble or meltable and the integration of the conjugated polymeric systems into devices is considerably simplified. Besides, the oCVD polymerization does not require high deposition temperature allowing the deposition to occur on a wide variety of materials.

DRAWINGS

FIG. 1 represents a schematic oCVD reactor used for depositing a conductive thin coating of directly fused poly (porphyrins), in accordance with various embodiments of the invention.

FIG. 3 represents unsuitable porphyrins for the oCVD of conjugated poly(porphyrin) coatings, in accordance with various embodiments of the invention.

DETAILED DESCRIPTION

Figure 2:
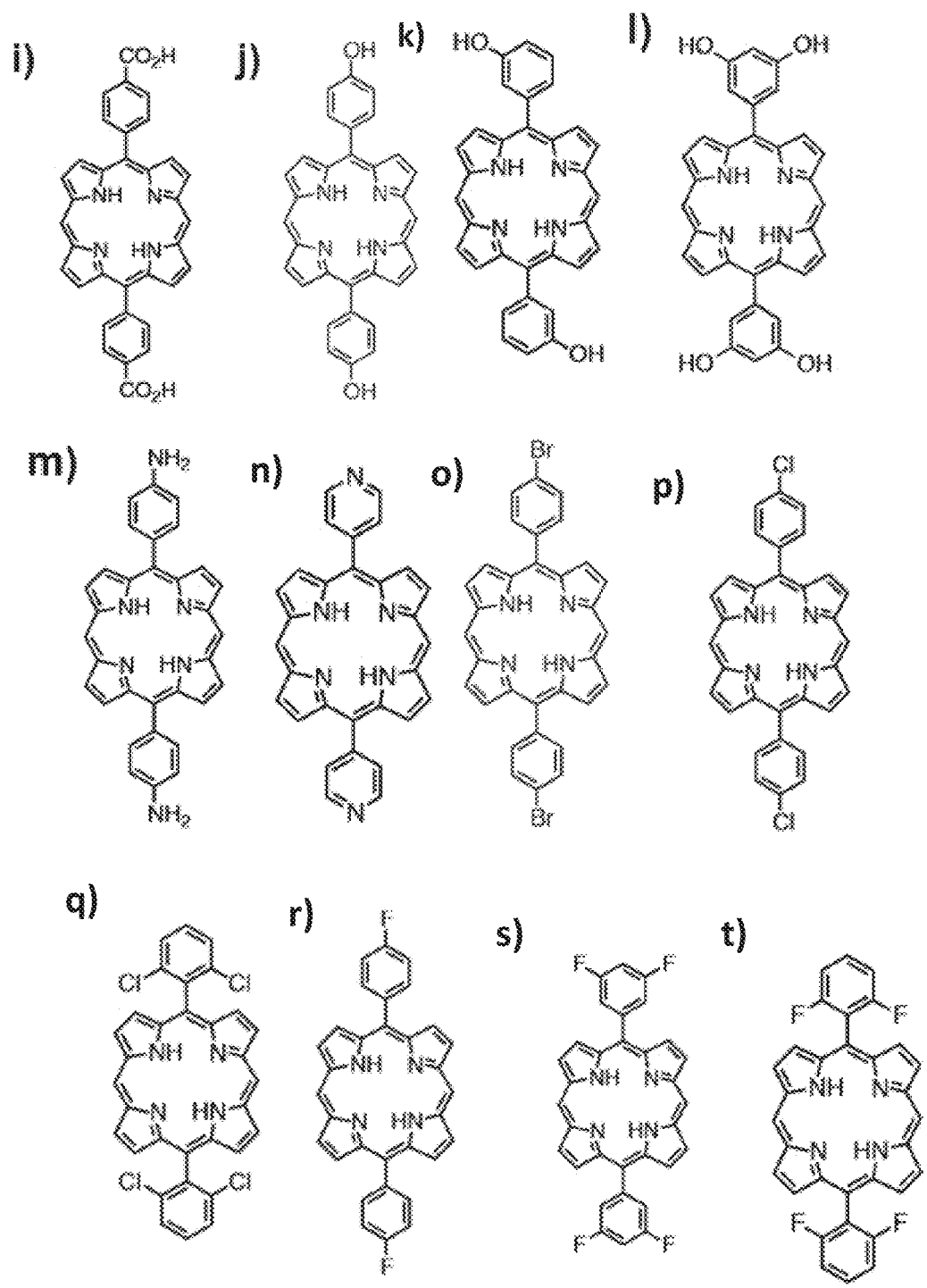
FIG. 2 represents examples of di-meso substituted porphyrins suitable for the oCVD of conductive doubly and/or triply fused poly(porphyrins) coatings, according to various embodiments of the method of the invention.

The invention provides a coating comprising polymers of meso-meso, β-β doubly linked and/or meso-β, β-meso doubly linked and/or meso-meso, β-β, β-β triply linked (poly) porphyrins, the polymers being represented as:

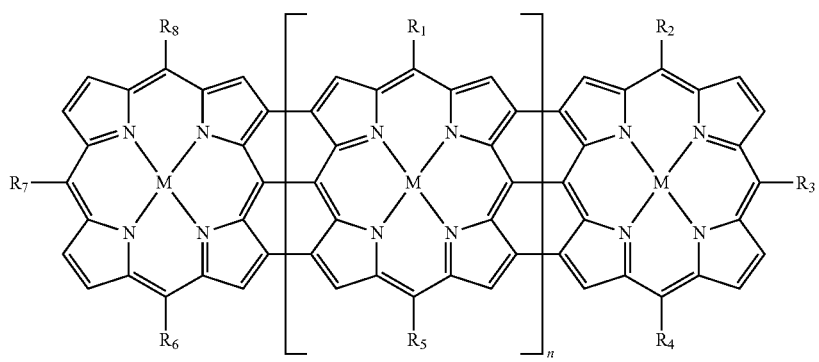

general formula 1 wherein $R_1$-$R_8$ are independently selected from the group: hydrogen, halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group.

M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi.

Each polymer of general formula 1 comprises n monomers, n is superior to 2 and the monomers of general formula 2 being the same or different. The polymer comprises at least 50 monomers n, in various instances more than 100 monomers n.

In various embodiments, $R_1$-$R_8$ are independently selected from the group: H, phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl and M is 2H or one metal atoms selected from the group of: Cr, Mn, Fe, Co, Ni, Cu, Zn, Ga, Pd, In, Pt.

The invention also provides a method for forming on a substrate a thin conductive coating of polymers of meso-meso, β-β doubly linked and/or meso-β, β-meso doubly linked and/or meso-meso, β-β, β-β triply linked (poly) porphyrins with oxidative Chemical Vapour deposition. The method comprises the steps of providing a substrate in a vacuum chamber and performing on the substrate an oxidative chemical vapour deposition reaction with an oxidant and at least one porphyrin monomer of general formula 2:

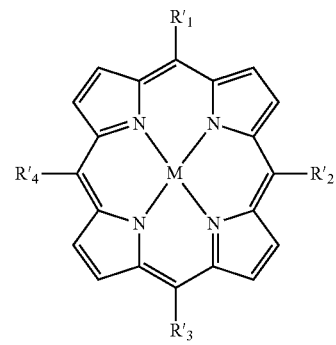

wherein at least two of $R'_1$-$R'_4$ are H, the others being respectively selected independently from the group consisting of: halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group.

M is 2H or a metal selected from the group of metal atoms of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi.

The at least two of $R'_1$-$R'_4$ are H, the others being respectively selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl.

$R'_1$ and $R'_3$ (or $R_2'$ and $R'_4$) are H and $R'_2$ and $R'_4$ (or $R'_1$ and $R'_3$) are both selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl, 3,5-di-trifluoromethylphenyl.

More particularly, the step of performing on a substrate an oxidative chemical vapour deposition reaction with an oxidant and at least one porphyrin monomer of formula 2 comprises sublimating separately the oxidant and the at least one porphyrin monomer in the vacuum chamber to form gaseous phases respectively and delivering the gaseous phases on the substrate. The oxidative chemical vapour deposition can also be performed with at least one cross-linking monomer being a mono-meso-substituted porphyrin monomer and/or porphine monomer. In this case, the cross-linking monomer is also sublimated during the oCVD in order to obtain a gaseous phase and the gaseous phase of the cross-linking monomer is also delivered on the substrate.

The oxidant is in various instances $FeCl_3$, $CuCl_2$ or $Cu(ClO_4)_2$. The oxidant is sublimated at a temperature comprises between 100° C. and 350° C. and the at least one porphyrin monomer of general formula 2 is sublimated at a temperature comprised between 200° C. and 300° C.

The oCVD experiments are performed with an oCVD reactor 2 (FIG. 1) comprising a vacuum chamber 4 and equipped with a dry scroll pump (Varian) and a turbomolecular pump (Agilent) to achieve high vacuum. A butterfly type throttling valve (VAT) and a microleak valve 6 fed with argon (Air Liquide, 99.999%) were used to maintain the pressure to $10^{-3}$ mbar for all the deposition experiments. Pressure was monitored by mean of a baratron vacuum gauge 8 (MKS). The substrate 10 is maintained in the vacuum chamber 4 with a substrate holder 12. At the bottom of the chamber 4 are two low temperature evaporation (LTE) point sources 14 (Kurt J. Lesker Co.) to supply the porphyrin and the oxidant to a temperature-controlled substrate holder (Thermocoax) located approximately 20 cm above. The number of point sources depends on the number of monomers.

FIG. 2 represents di-meso-substituted porphyrins suitable for the oxidative chemical vapour deposition of conductive doubly and triply fused polyporphyrin coatings. a) 5,15-di(phenyl)porphyrin, b) 5,15-di(p-tolyl)porphyrin, c) 5,15-di(mesityl)porphyrin, d) 5,15-di(4-tert-butylphenyl)porphyrin, e) 5,15-di(3,5-di-tert-butylphenyl)porphyrin, f) 5,15-di(2,6-di-octyloxyphenyl)porphyrin, g) 5,15-di(2,6-di-dodecyloxyphenyl)porphyrin, h) 5,15-di(3,4,5-tri-trimethoxyphenyl)porphyrin, i) 5,15-di(4-carboxyphenyl)porphyrin, j) 5,15-di(4-hydroxyphenyl)porphyrin, k) 5,15-di(3-hydroxyphenyl)porphyrin, l) 5,15-di(3,5-di-hydroxyphenyl)porphyrin, m) 5,15-di(4-aminophenyl)porphyrin, n) 5,15-di(4-pyridyl)porphyrin, o) 5,15-di(4-bromophenyl)porphyrin, p) 5,15-di(4-chlorophenyl)porphyrin, q) 5,15-di(2,6-chlorophenyl)porphyrin, r) 5,15-di(4-fluorophenyl)porphyrin, s) 5,15-di(3,5-di-fluorophenyl)porphyrin, t) 5,15-di(2,6-di-fluorophenyl)porphyrin, u) 5,15-di(pentafluorophenyl)porphyrin, v) 5,15-di(4-trifluoromethylphenyl)porphyrin, w) 5,15-di(3,5-di-trifluoromethylphenyl)porphyrin.

The di-meso-substituted porphyrins may be metalized with chromium (II), manganese (III), iron (III), cobalt (II), nickel (II), copper (II), zinc (II), gallium (III), palladium (II), indium (III) and platinum (II), the metallic being represented by M in general formula 2.

Tri-meso-substituted porphyrins can act as end-groups. Di-meso-substituted porphyrins are suitable for the formation of linear chains. Mono-meso-substituted porphyrins and porphines can be employed as cross-linking units.

FIG. 3 represents porphyrins unsuitable for the oxidative chemical vapour deposition of conjugated porphyrin coatings. a-e) Tetra-meso-substituted porphyrins and f) beta-substituted porphyrins. Porphyrins bearing one or more c) ethenyl and d-h) ethynyl groups, commonly used in the solution-based synthesis of conjugated porphyrin arrays, undergo rapid decomposition during their tentative sublimation.

Example 1—NiDPP & $FeCl_3$

Figure 4:
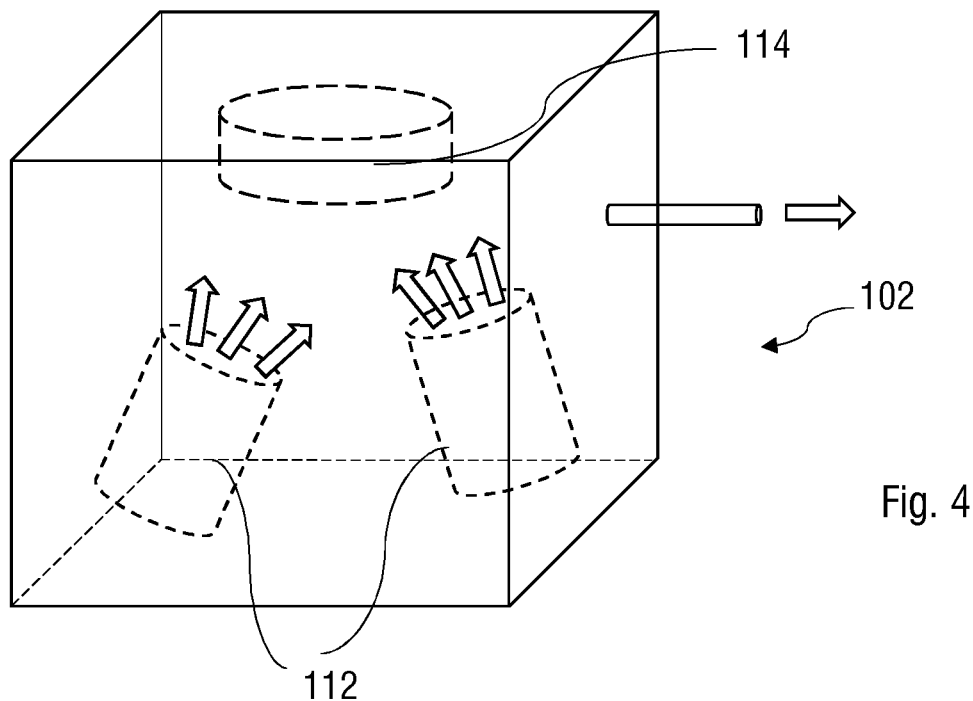
FIG. 4 is a schematic representation of the oCVD reactor according to an example of coating, in accordance with various embodiments of the invention.

The oxidative chemical vapour deposition reaction of nickel (II) 5,15-di(phenyl)porphyrin (NiDPP) and iron (III) chloride ($FeCl_3$) was performed in a custom-built reactor 102 (FIG. 4) equipped with a dry scroll pump and a turbomolecular pump to achieve high vacuum. A butterfly type throttling valve and a microleak valve fed with argon were used to maintain the pressure to $10^{-3}$ mbar for all the deposition experiment duration. Pressure was monitored by means of a baratron vacuum gauge. At the bottom of the chamber, two low temperature evaporation point sources 112 were used to supply the NiDPP porphyrin and the $FeCl_3$ oxidant to a temperature-controlled substrate holder located approximately 20 cm above. The evaporators were loaded with 10 mg of NiDPP and 150 mg of $FeCl_3$ and heated to 235° C. and 150° C., respectively. The substrate holder 114 was maintained at 150° C. and the deposition time was 30 minutes.

Figure 5:
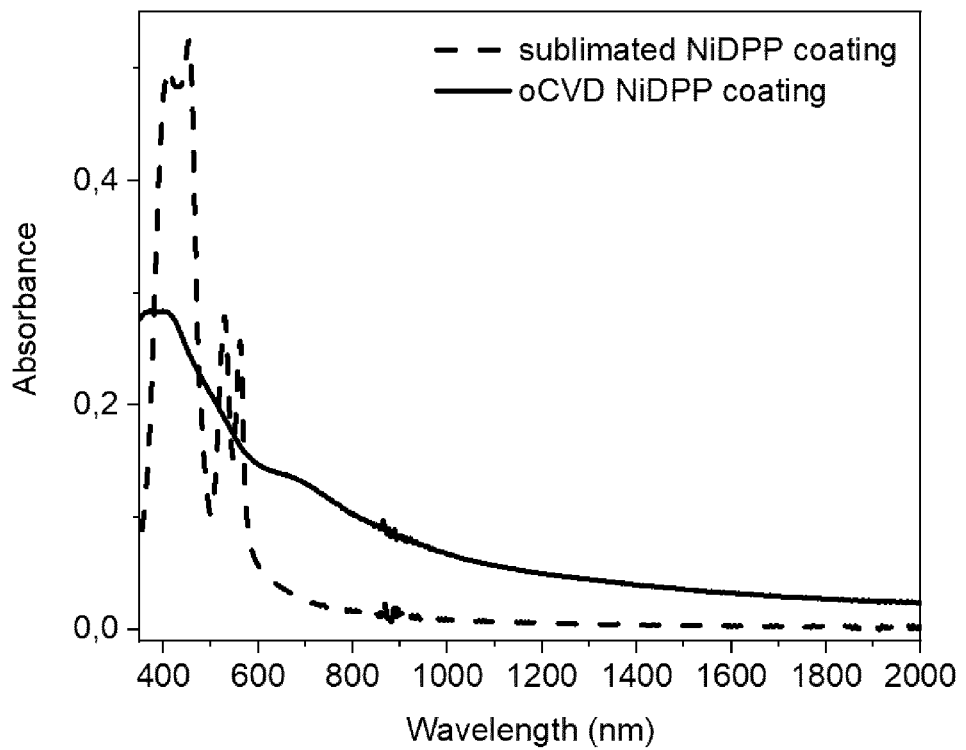
FIG. 5 is a UV-Vis-NIR absorption spectrum of the P(NiDPP) coating obtained from the oCVD reaction of NiDPP and $FeCl_3$, in accordance with various embodiments of the invention.

The oCVD NiDPP coating elaborated from the oCVD reaction of NiDPP and $FeCl_3$ exhibits a dark green coloration that contrasts with vivid orange coloration of the reference NiDPP coating elaborated from the sublimation of NiDPP under the same operating conditions. Ultraviolet-visible-near-infrared (UV-Vis-NIR) spectroscopic analysis, performed on coated glass substrates using an UV-Vis-NIR spectrophotometer (Perkin Elmer, Lambda 950) with a 150 mm diameter integrating sphere, reveals significant differences in the absorption spectrum of the dark green oCVD NiDPP coating with respect to the orange reference NiDPP coating. The absorption around 360 nm increases, the Soret band broadens, the redshifted Q bands collapse to a new broad band around 668 nm and, more importantly, broad absorptions appear in the NIR region up to 2000 nm (FIG. 5). These observations are in full agreement with the formation of fused porphyrins that typically exhibit broad absorptions that can reach the NIR spectral region. In contrast to the soluble reference NiDPP coating, the oCVD NiDPP coating is insoluble in common organic solvents such as DCM, acetone or chloroform.

Figure 6:
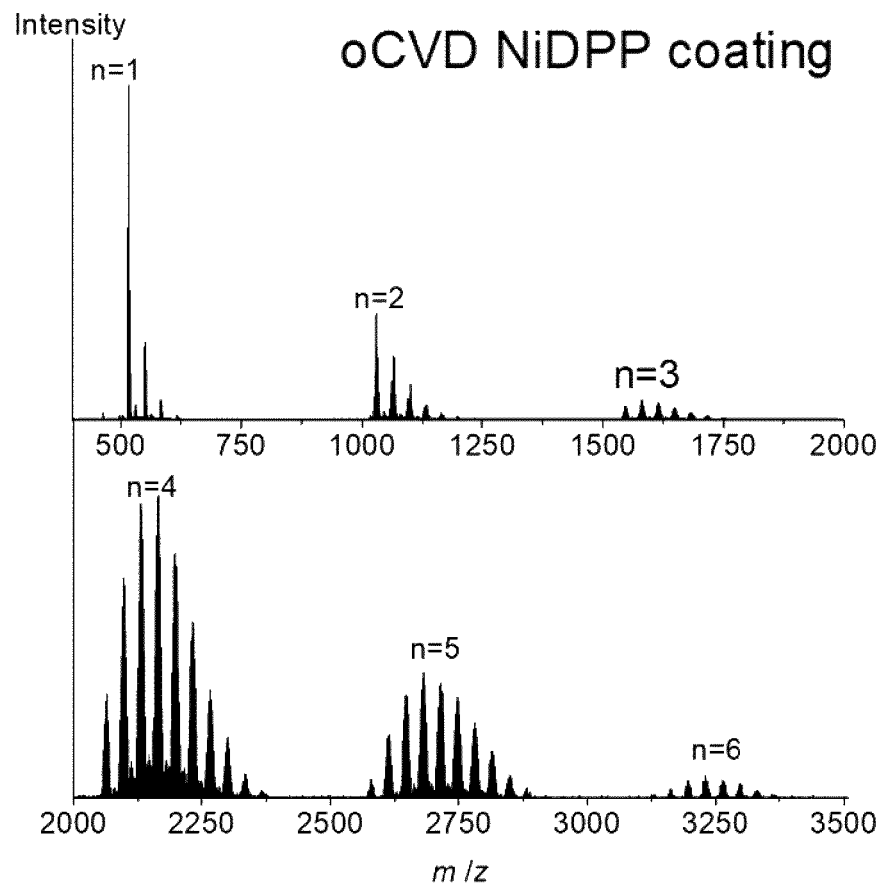
FIG. 6 represents LDI-HRMS spectra of the P(NiDPP) coating obtained from the oCVD reaction of NiDPP and $FeCl_3$, in accordance with various embodiments of the invention.

Laser desorption/ionization high-resolution mass spectra (LDI-HRMS) analysis of the oCVD NiDPP coating, performed on an AP-MALDI PDF+ ion source from MassTech, Inc. coupled to an LTQ/Orbitrap Elite from Thermo Scientific, reveals the presence of NiDPP oligomers confirming the successful oxidative polymerization of NiDPP (FIG. 6). The signal related to the presence of the free-base porphyrin H$_2$DPP is negligibly weak, confirming that NiDPP effectively retains the nickel ion in the porphyrin core during the deposition and polymerization. Up to heptameric oligomers are observed in the mass spectrum up to m/z=4000 (instrumental limit). Unfortunately, the insolubility of the film prohibits GPC analysis and consequently the detailed mass distribution of the poly(porphyrin) chains remains elusive. On the other hand, the absorptions up to 2000 nm in the UV-Vis-NIR absorption spectrum (FIG. 5) strongly suggest the presence of highly conjugated poly(porphyrins) since singly linked porphyrins are NIR transparent. The mass spectrometric analysis confirms the formation of multiple C—C bonds between the porphyrin units. The LDI-HRMS spectra display signals related to the formation of triply linked β-β/meso-meso/β-β porphyrins. This is in contrast to solution-based oxidative polymerization processes delivering only double meso-β/meso-β linkages between NiDPP. LDI-HRMS reveals another unexpected difference between the oCVD approach and the reported solution-based methods. For the peak distributions related to both the NiDPP monomer and NiDPP oligomers, the LDI-HRMS spectrum (FIG. 6) exhibits signals suggesting the simultaneous elimination of two hydrogen atoms 2H. Since the maximum number of hydrogen pairs eliminated is proportional to the number of phenyl rings in the detected monomeric and oligomeric species, we attribute these signals to dehydrogenated species. It is suggested that these species could have formed by intramolecular cyclization reactions between the phenyl substituents and the porphyrin pyrrole beta positions. Since fused porphyrins coatings being electrically conductive are expected, basic charge transport properties of the oCVD NiDPP coating were investigated using a microprobe station (Cascade Microtech, PM8). 2-point current-voltage scans were recorded and the (lateral) thin-film conductivity was calculated from a simple linear fit (Ohm's law). The measurements were performed at room temperature and under ambient atmosphere and the geometry of the channel was 2.5 μm (length)×10 mm (total width)×40 nm (height). The data were recorded using a Keithley (2401) source meter by sweeping the voltage from –4 V to 4 V and back (hysteresis scan) at a scan rate of 500 mV s$^{-1}$. Contact resistance between the Au contacts and the thin film are neglected when using 2-point probe measurements (as opposed to 4-pont probe measurements) because the film's conductivity was high enough to neglect this parameter.

Figure 7:
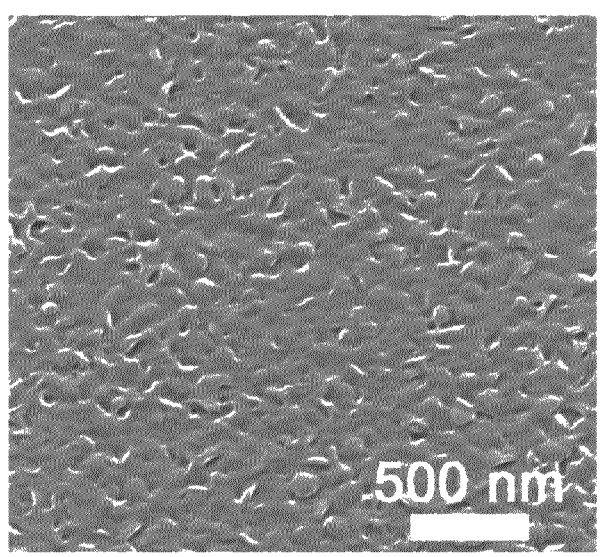
FIG. 7 represents a Helium ion microscopy image of the P(NiDPP) coating obtained from the oCVD reaction of NiDPP and $FeCl_3$, in accordance with various embodiments of the invention.

FIG. 7 represents the Helium ion microscopy image of the P(NiDPP) coating obtained from the oCVD reaction of NiDPP and FeCl$_3$ which shows that a thin film is obtained.

Figure 8:
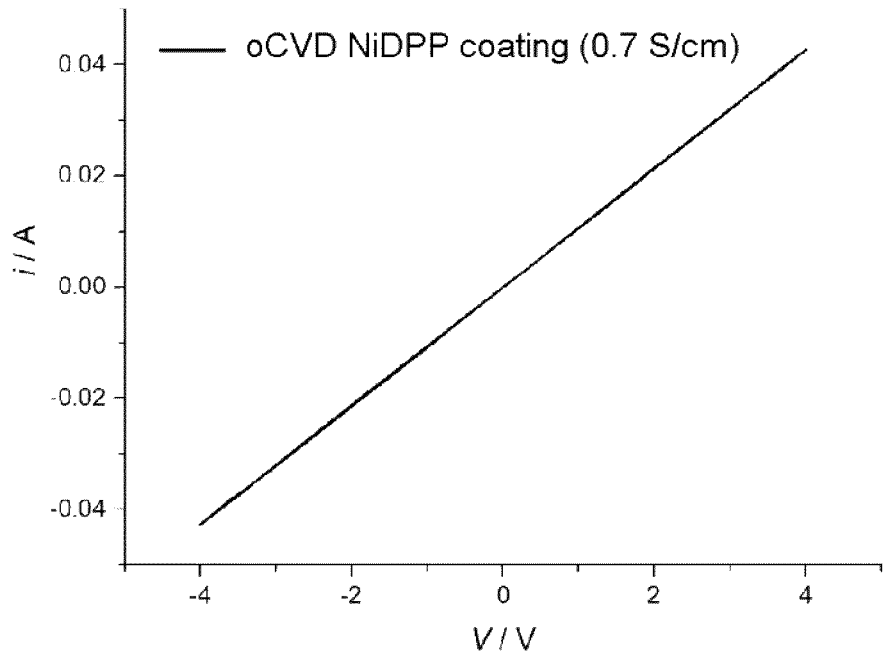
FIG. 8 represents the lateral electrical conductivity measurement of the P(NiDPP) coating obtained from the oCVD reaction of NiDPP and $FeCl_3$, in accordance with various embodiments of the invention.

The electrical conductivity of the oCVD NiDPP coating deposited onto a commercial OFET chip was measured without applying any gate voltage and recording the current-voltage scans with a 2-point probe in order to extract the conductivity using Ohm's law. Gratifyingly, the oCVD NiDPP coating displays an electrical ohmic conductivity for poly(porphyrin) compounds with a value of 0.7 S·cm$^{-1}$ (FIG. 8). The measured conductivity suggests however that the oCVD NiDPP coating is a p-doped semiconducting material thanks to the excess of FeCl$_3$ that is known to act as doping agent during the oCVD method. Unfortunately, determining the hole mobility via field-effect measurements proved impossible due to the high conductivity of the oCVD NiDPP coating (p-doped), which results in the channel being ON already at zero gate voltage.

Example 2—NiDDt-BuPP & FeCl$_3$

Figure 9:
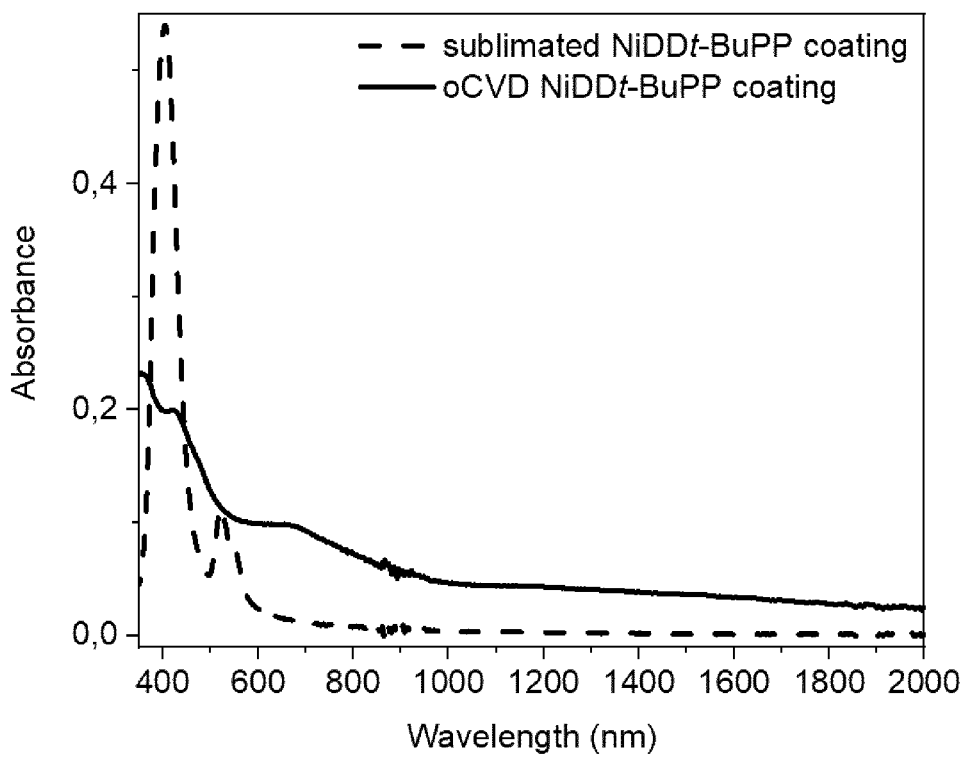
FIG. 9 represents the UV-Vis-NIR absorption spectrum of the P(NiDDt-BuPP) coating obtained from the oCVD reaction of NiDDt-BuPP and $FeCl_3$, in accordance with various embodiments of the invention.

The oxidative chemical vapour deposition reaction of nickel (II) 5,15-di(3,5-di-tert-butylphenyl) porphyrin (NiDDt-BuPP) and iron (III) chloride (FeCl$_3$) was performed in the custom-built oCVD reactor described above. The pressure was 10$^{-3}$ mbar and the substrate temperature was 150° C. for all the deposition experiment duration. The evaporators were loaded with 10 mg of NiDDt-BuPP and 150 mg of FeCl$_3$ and heated to 260° C. and 150° C., respectively. The oCVD NiDDt-BuPP coating elaborated from the oCVD reaction of NiDDt-BuPP and FeCl$_3$ exhibits a dark green coloration that contrasts with vivid orange coloration of the reference NiDDt-BuPP coating elaborated from the sublimation of NiDDt-BuPP under the same operating conditions. UV-Vis-NIR spectroscopic analysis of the oCVD NiDDt-BuPP coating revealed a broadening and bathochromic shift of the Soret and Q bands, as well as the apparition of a broad absorption in the NIR region up to 2000 nm (FIG. 9). This absorption up to 2000 nm suggests the formation of highly conjugated poly(porphyrins). Pentameric oligomers are observed by mass spectrometry, up to m/z=4000 which corresponds to the instrumental limit. The LDI-HRMS analysis confirms the formation of multiple C—C bonds between the NiDDt-BuPP units. The insolubility of the oCVD NiDDt-BuPP coating prohibits GPC analysis and consequently the detailed mass distribution of the P(NiDDt-BuPP) chains remains elusive. Nevertheless, the strong absorption in the NIR region (FIG. 9) indicates the presence of highly conjugated poly(porphyrins).

Example 3—NiDDOPP & FeCl$_3$

Figure 10:
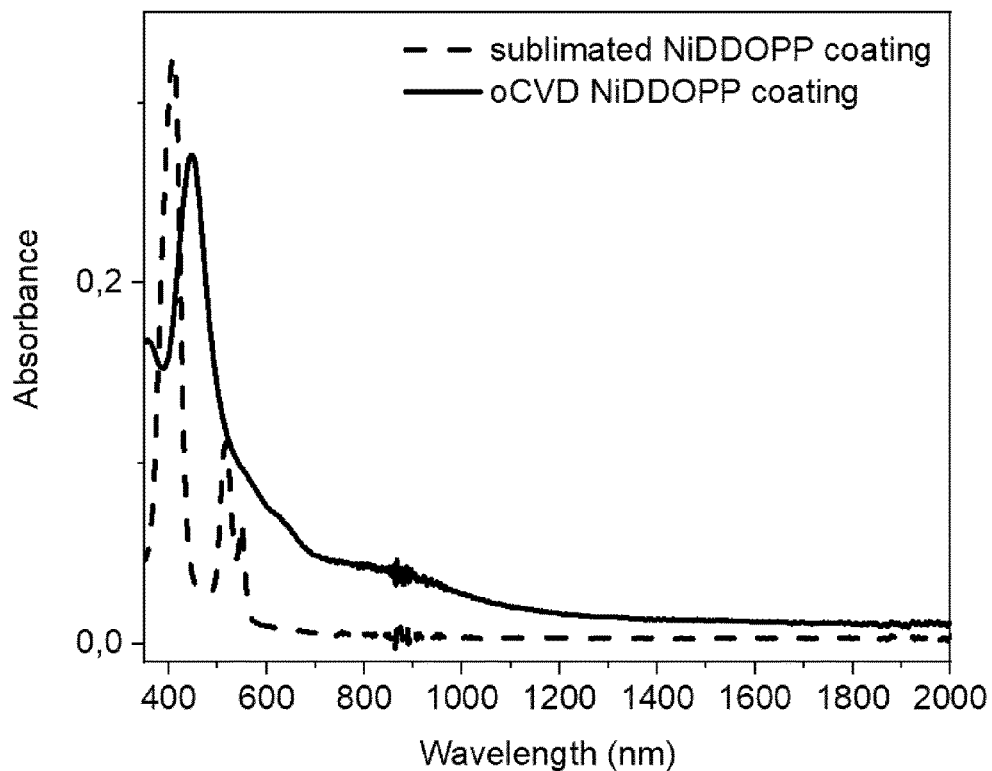
FIG. 10 represents the UV-Vis-NIR absorption spectrum of the P(NiDDOPP) coating obtained from the oCVD reaction of NiDDOPP and $FeCl_3$, in accordance with various embodiments of the invention.

The oxidative chemical vapour deposition reaction of nickel (II) 5,15-di(2,6-dodecyloxyphenyl) porphyrin (NiDDOPP) and iron (III) chloride (FeCl$_3$) was performed in the custom-built oCVD reactor described above. The pressure was 10$^{-3}$ mbar and the substrate temperature was 150° C. for all the deposition experiment duration. The evaporators were loaded with 10 mg of NiDDOPP and 150 mg of FeCl$_3$ and heated to 270° C. and 150° C., respectively. The oCVD NiDDOPP coating elaborated from the oCVD reaction of NiDDOPP and FeCl$_3$ exhibits a greenish coloration that contrasts with pink coloration of the reference NiDDOPP coating elaborated from the sublimation of NiDDOPP under the same operating conditions. UV-Vis-NIR spectroscopic analysis of the oCVD NiDDOPP coating revealed a broadening and bathochromic shift of the Soret and Q bands, as well as the apparition of a broad absorption in the NIR region up to 2000 nm (FIG. 10). This absorption up to 2000 nm suggests the formation of highly conjugated poly(porphyrins). Trimeric oligomers are observed by mass spectrometry, up to m/z=4000 which corresponds to the instrumental limit. The LDI-HRMS analysis confirms the formation of P(NiDDOPP) oligomers with multiple C—C bonds between the NiDDOPP units. The insolubility of the oCVD NiDDOPP coating prohibits GPC analysis and consequently the detailed mass distribution of the P(NiDDOPP) chains remains elusive. Nevertheless, the strong absorption in the NIR region (FIG. 10) indicates the presence of highly conjugated poly(porphyrins).

Example 4—ZnDPOHP & FeCl$_3$

The oxidative chemical vapour deposition reaction of zinc (II) 5,15-di(4-hydroxyphenyl) porphyrin (ZnDPOHP) and iron (III) chloride (FeCl$_3$) was performed in the custom-built oCVD reactor described above. The pressure was 5×10$^{-4}$ mbar and the substrate temperature was 100° C. for all the deposition experiment duration. The evaporators were loaded with ZnDPOHP and FeCl$_3$ and heated to 250° C. and 110° C., respectively. The oCVD ZnDPOHP coating elaborated from the oCVD reaction of ZnDPOHP and FeCl$_3$ exhibits a greenish coloration that contrasts with orangish coloration of the reference ZnDPOHP coating elaborated from the sublimation of ZnDPOHP under the same operating conditions. UV-Vis-NIR spectroscopic analysis of the oCVD ZnDPOHP coating revealed a broadening and bathochromic shift of the Soret and Q bands, as well as the apparition of a broad absorption in the NIR region up to 2000 nm. This absorption up to 2000 nm suggests the formation of highly conjugated poly(porphyrins). The LDI-HRMS analysis confirms the formation of P(ZnDPOHP) oligomers with multiple C—C bonds between the ZnDPOHP units. The insolubility of the oCVD ZnDPOHP coating prohibits GPC analysis and consequently the detailed mass distribution of the P(ZnDPOHP) chains remains elusive. Nevertheless, the strong absorption in the NIR region indicates the presence of highly conjugated poly(porphyrins).

Example 5—NiDPFPP & FeCl$_3$

The oxidative chemical vapour deposition reaction of nickel (II) 5,15-di(pentafluorophenyl)porphyrin (NiDPFPP) and iron (III) chloride (FeCl$_3$) was performed in the custom-built oCVD reactor described above. The pressure was 10$^{-2}$ mbar and the substrate temperature was 100° C. for all the deposition experiment duration. The evaporators were loaded with NiDPFPP and FeCl$_3$ and heated to 275° C. and 170° C., respectively. The oCVD NiDPFPP coating elaborated from the oCVD reaction of NiDPFPP and FeCl$_3$ exhibits a greenish coloration that contrasts with orangish coloration of the reference NiDPFPP coating elaborated from the sublimation of NiDPFPP under the same operating conditions. UV-Vis-NIR spectroscopic analysis of the oCVD NiDPFPP coating revealed a broadening and bathochromic shift of the Soret and Q bands, as well as the apparition of a broad absorption in the NIR region up to 2000 nm. This absorption up to 2000 nm suggests the formation of highly conjugated poly(porphyrins). Pentameric oligomers are observed by mass spectrometry, up to m/z=4000 which corresponds to the instrumental limit. The LDI-HRMS analysis confirms the formation of multiple C—C bonds between the NiDPFPP units. The insolubility of the oCVD NiDPFPP coating prohibits GPC analysis and consequently the detailed mass distribution of the P(NiDPFPP) chains remains elusive. Nevertheless, the strong absorption in the NIR region indicates the presence of highly conjugated poly(porphyrins).

Example 6—NiDMP & FeCl$_3$

Figure 11:
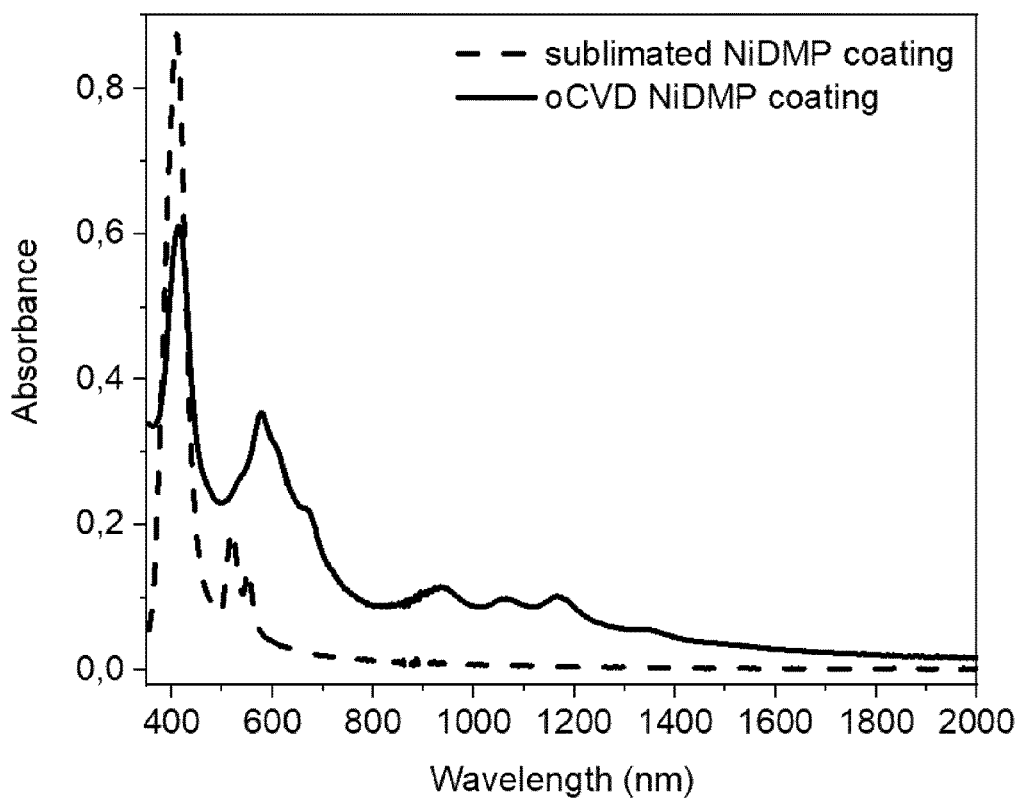
FIG. 11 represents the UV-Vis-NIR absorption spectrum of the P(NiDMP) coating obtained from the oCVD reaction of NiDMP and $FeCl_3$, in accordance with various embodiments of the invention.

The oxidative chemical vapour deposition reaction of nickel (II) 5,15-di(mesityl)porphyrin (NiDMP) and iron (III) chloride (FeCl$_3$) was performed in the custom-built oCVD reactor described above. The pressure was 10$^{-3}$ mbar and the substrate temperature was 150° C. for all the deposition experiment duration. The evaporators were loaded with 10 mg of NiDMP and 150 mg of FeCl$_3$ and heated to 230° C. and 150° C., respectively. The oCVD NiDMP coating elaborated from the oCVD reaction of NiDMP and FeCl$_3$ exhibits a dark green coloration that contrasts with orange coloration of the reference NiDMP coating elaborated from the sublimation of NiDMP under the same operating conditions. UV-Vis-NIR spectroscopic analysis of the oCVD NiDMP coating revealed a broadening and bathochromic shift of the Soret and Q bands, as well as the apparition of new Q bands at longer wavelengths and a broad absorption in the NIR region up to 2000 nm (FIG. 11). This absorption up to 2000 nm suggests the formation of highly conjugated poly(porphyrins). Hexameric oligomers are observed by mass spectrometry, up to m/z=4000 which corresponds to the instrumental limit. The LDI-HRMS analysis confirms the formation of multiple C—C bonds between the NiDMP units. The strong absorption in the NIR region (FIG. 11) indicates the presence of highly conjugated poly(porphyrins).

Figure 12:
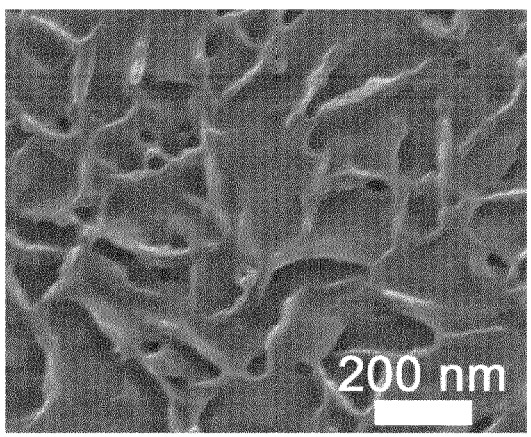
FIG. 12 represents the helium ion microscopy image of the P(NiDMP) coating obtained from the oCVD reaction of NiDMP and $FeCl_3$, in accordance with various embodiments of the invention.

FIG. 12 represents a Helium ion microscopy image of the P(NiDMP) coating obtained from the oCVD reaction of NiDMP and FeCl$_3$.

Figure 13:
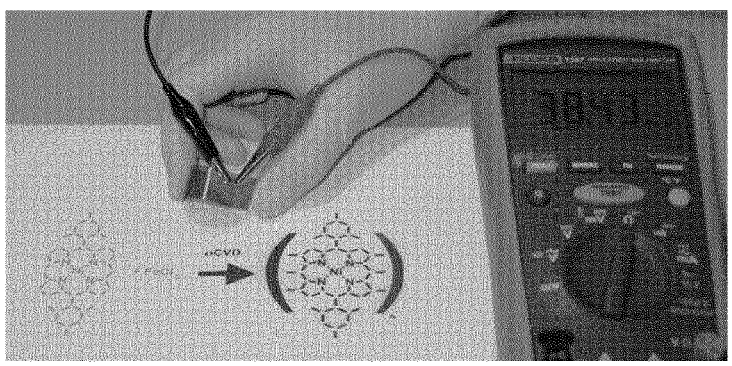
FIG. 13 represents a photograph of an A4 sheet of printer paper coated by (left) the orange reference NiDMP coating (evaporated) and (right) the dark green poly (NiDMP) coating prepared from the oCVD reaction of NiDMP with $FeCl_3$ using a patterned mask, in accordance with various embodiments of the invention.

Example 7—Patterned Conductive Directly-Fused Porphyrins Coating on Paper and Polymer Substrates The oxidative chemical vapour deposition reaction of nickel (II) 5,15-di(mesityl)porphyrin (NiDMP) and iron (III) chloride (FeCl$_3$) was performed on paper and polyethylene naphthalate (PEN) substrates in the custom-built oCVD reactor described above. The pressure was 10$^{-3}$ mbar and the substrate temperature was 50° C. for all the deposition experiment duration. The evaporators were loaded with 10 mg of NiDMP and 150 mg of FeCl$_3$ and heated to 230° C. and 130° C., respectively. The oCVD NiDMP coating elaborated from the oCVD reaction of NiDMP and FeCl$_3$ exhibits a dark green coloration that contrasts with orange coloration of the reference NiDMP coating elaborated from the sublimation of NiDMP under the same operating conditions (FIG. 13). The patterned P(NiDMP) coating perfectly resembles the used mask with conjugated poly(porphyrin) lines as thin as one millimetre. Interestingly, electrical conductivity was even observed for the oCVD NiDPP coating deposited on printer paper and PEN foil (FIG. 13).

Example 8—H$_2$DPP & FeCl$_3$

Figure 14:
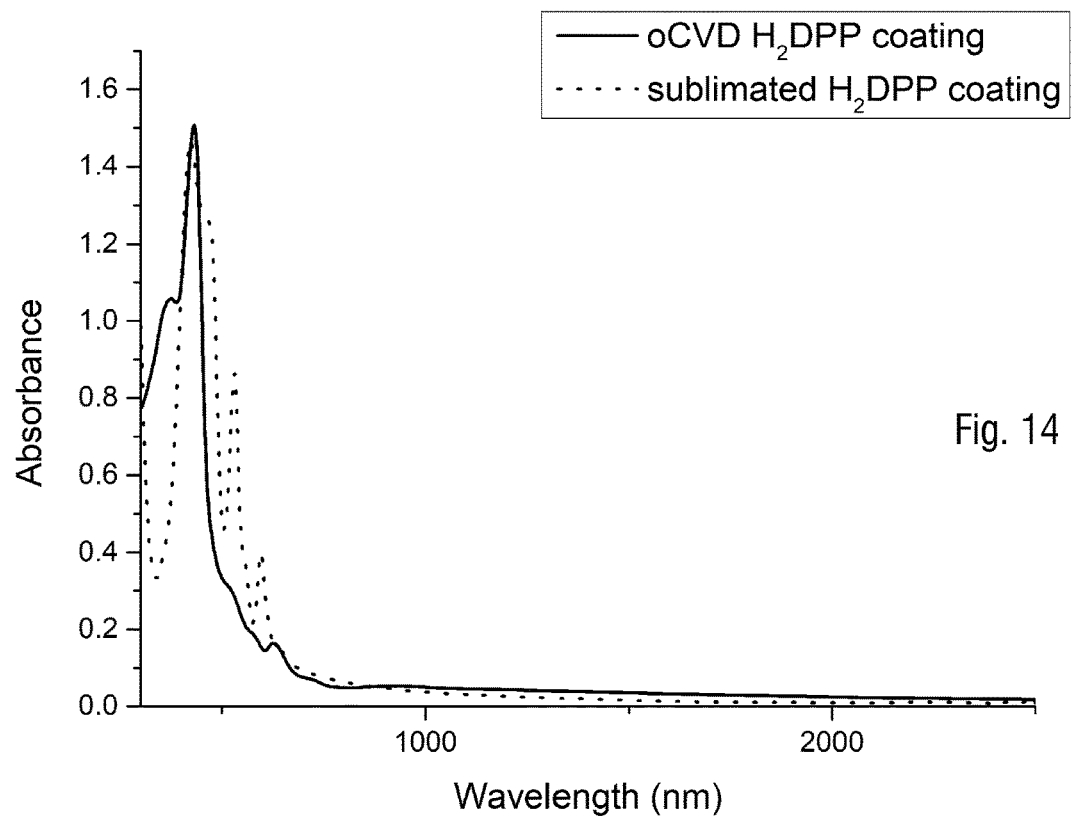
FIG. 14 represents the UV-Vis-NIR absorption spectrum of the coating obtained from the oCVD reaction of $H_2DPP$ and $FeCl_3$, in accordance with various embodiments of the invention.
Figure 15:
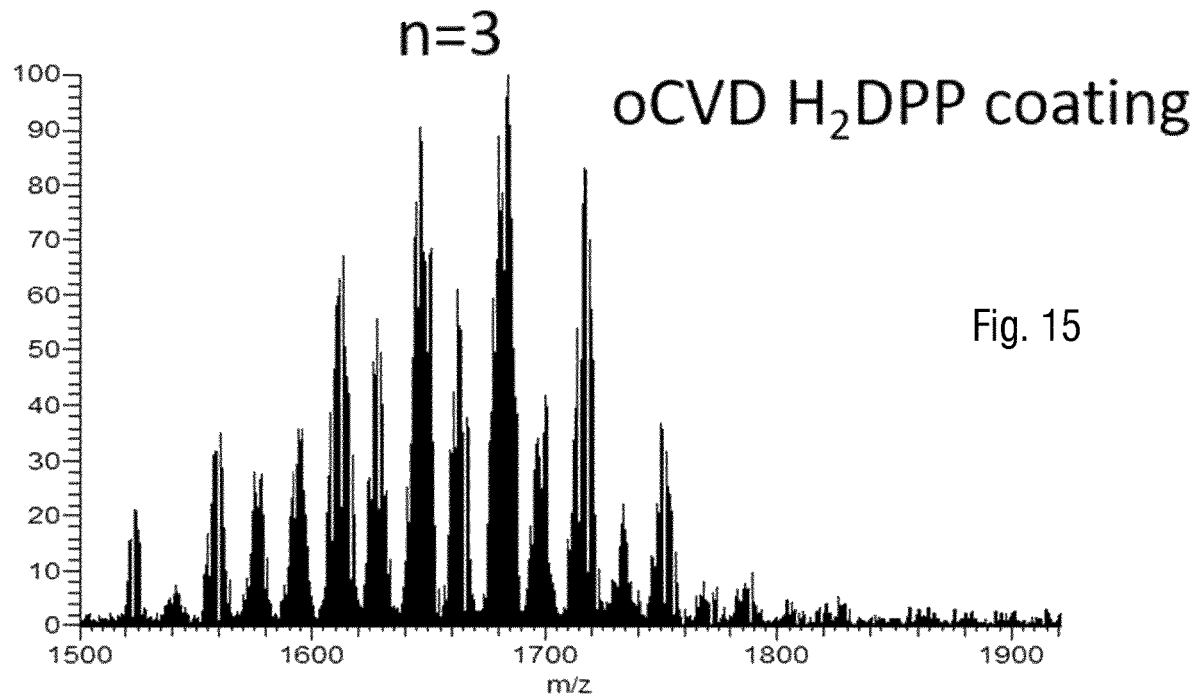
FIG. 15 represents the LDI-HRMS spectra of the coating obtained from the oCVD reaction of $H_2DPP$ and $FeCl_3$, in accordance with various embodiments of the invention.

The oxidative chemical vapour deposition reaction of 5,15-di(phenyl)porphyrin (H$_2$DPP) and iron (III) chloride (FeCl$_3$) was performed in the custom-built oCVD reactor described above. The pressure was 10$^{-3}$ mbar and the substrate temperature was 130° C. for all the deposition experiment duration. The evaporators were loaded with 10 mg of H$_2$DPP and 150 mg of FeCl$_3$ and heated to 250° C. and 150° C., respectively. The oCVD H$_2$DPP coating elaborated from the oCVD reaction of H$_2$DPP and FeCl$_3$ exhibits a green coloration that contrasts with the purple coloration of the H$_2$DPP reference coating elaborated from the sublimation of H$_2$DPP under the same operating conditions. UV-Vis-NIR spectroscopic analysis of the oCVD H$_2$DPP coating revealed a broadening and a bathochromic shift of the Soret and Q bands, as well as the apparition of new Soret band at lower wavelength. The spectra show a weak broad absorption in the NIR region up to 2000 nm (FIG. 14). This absorption up to 2000 nm suggests the formation of conjugated poly(porphyrins). Trimeric oligomers are observed by mass spectrometry (FIG. 15). The LDI-HRMS analysis highlight the introduction of iron into the porphyrin core and confirms the formation of multiple C—C bonds between the porphyrin units.

Example 9—CoDPP & $FeCl_3$

Figure 16:
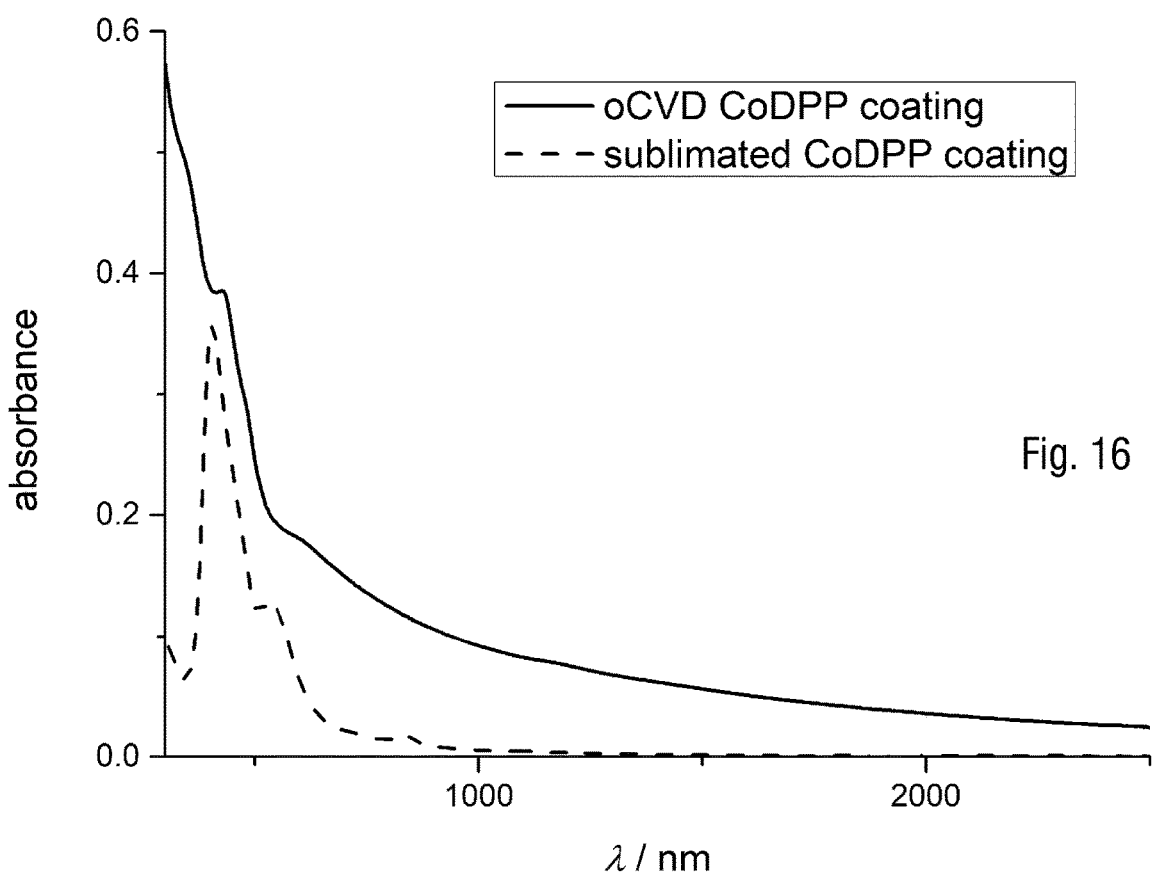
FIG. 16 represents the UV-Vis-NIR absorption spectrum of the P(CoDPP) coating obtained from the oCVD reaction of CoDPP and $FeCl_3$, in accordance with various embodiments of the invention.

The oxidative chemical vapour deposition reaction of cobalt (II) 5,15-di(phenyl)porphyrin (CoDPP) and iron (III) chloride ($FeCl_3$) was performed in the custom-built oCVD reactor described above. The pressure was $10^{-3}$ mbar and the substrate temperature was 130° C. for all the deposition experiment duration. The evaporators were loaded with 10 mg of CoDPP and 150 mg of $FeCl_3$ and heated to 250° C. and 150° C., respectively. The oCVD CoDPP coating elaborated from the oCVD reaction of CoDPP and $FeCl_3$ exhibits a dark green coloration that contrasts with the orange coloration of the reference CoDPP coating elaborated from the sublimation of CoDPP under the same operating conditions. UV-Vis-NIR (UV-Visible-Near Infrared) spectroscopic analysis of the oCVD CoDPP coating revealed a broadening and bathochromic shift of the Soret and Q bands, as well as the apparition of a broad absorption in the NIR region up to 2500 nm (FIG. 16). The absorbance of the coating in the UV Vis-NIR shows that the polymer in the coating comprises at least 100 monomers. The LDI-HRMS analysis confirms the formation of P(CoDPP) oligomers with of multiple C—C bonds between the CoDPP units.

Example 10—PdDPP & $FeCl_3$

Figure 17:
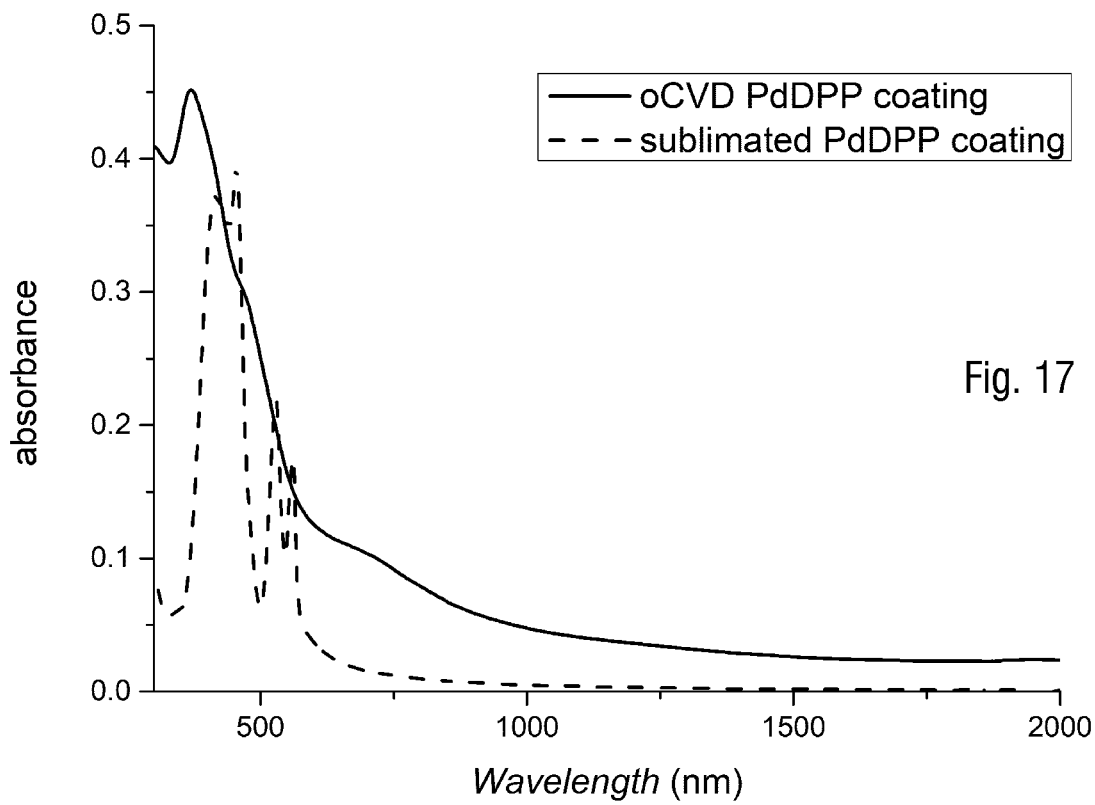
FIG. 17 is the UV-Vis-NIR absorption spectrum of the P(PdDPP) coating obtained from the oCVD reaction of PdDPP and $FeCl_3$, in accordance with various embodiments of the invention.

The oxidative chemical vapour deposition reaction of palladium (II) 5,15-di(phenyl)porphyrin (PdDPP) and iron (III) chloride ($FeCl_3$) was performed in the custom-built oCVD reactor described above. The pressure was $10^{-3}$ mbar and the substrate temperature was 130° C. for all the deposition experiment duration. The evaporators were loaded with 10 mg of PdDPP and 150 mg of $FeCl_3$ and heated to 260° C. and 150° C., respectively. The oCVD PdDPP coating elaborated from the oCVD reaction of PdDPP and $FeCl_3$ exhibits a dark orange coloration that contrasts with the orange of the reference PdDPP coating elaborated from the sublimation of PdDPP under the same operating conditions. UV-Vis-NIR spectroscopic analysis of the oCVD PdDPP coating revealed a broadening and bathochromic shift of the Soret and Q bands, as well as the apparition of a broad absorption in the NIR region up to 2000 nm (FIG. 17). This absorption up to 2000 nm suggests the formation of highly conjugated poly(porphyrins). The LDI-HRMS analysis confirms the formation of P(PdDPP) oligomers with multiple C—C bonds between the PdDPP units.

Example 11—ZnDPP & $FeCl_3$

Figure 18:
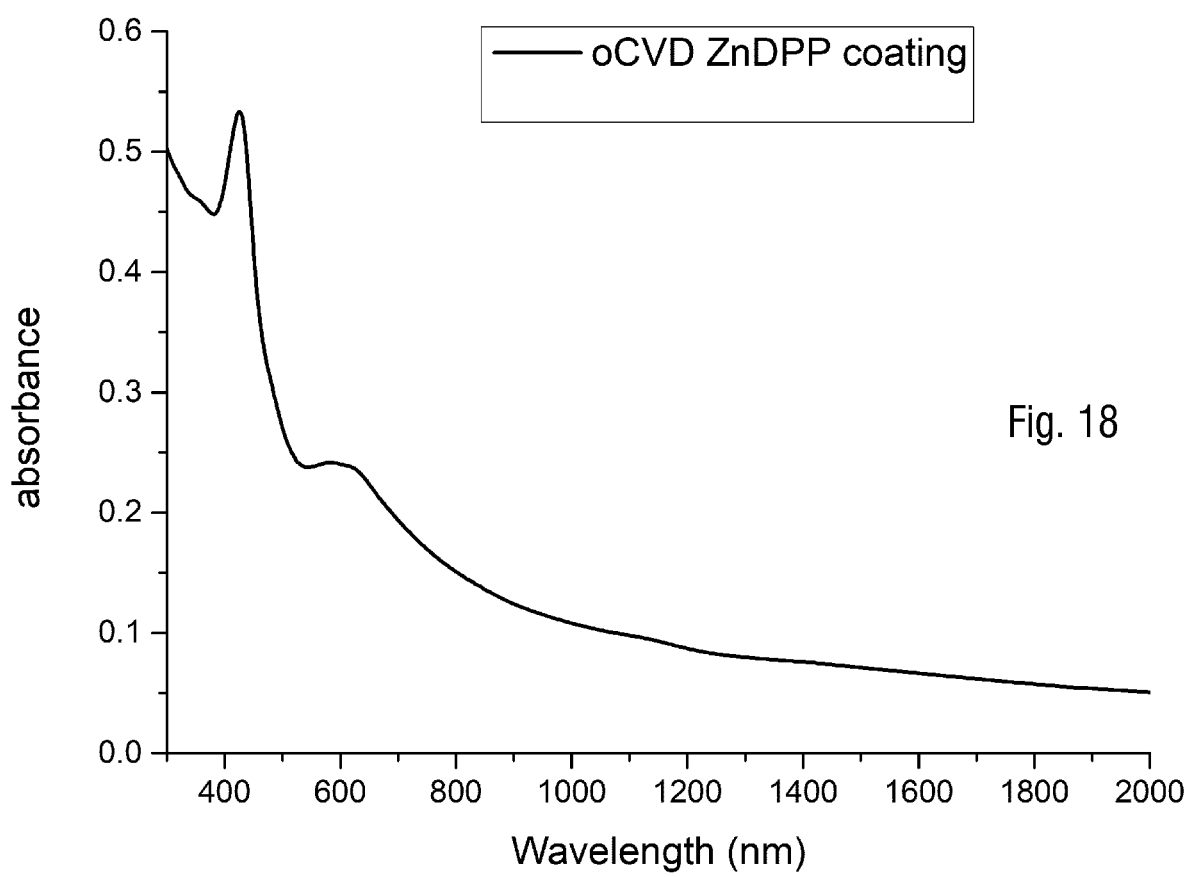
FIG. 18 represents the UV-Vis-NIR absorption spectrum of the P(ZnDPP) coating obtained from the oCVD reaction of ZnDPP and $FeCl_3$, in accordance with various embodiments of the invention.

The oxidative chemical vapour deposition reaction of zinc (II) 5,15-di(diphenyl)porphyrin (ZnDPP) and iron (III) chloride ($FeCl_3$) was performed in the custom-built oCVD reactor described above. The pressure was $10^{-3}$ mbar and the substrate temperature was 130° C. for all the deposition experiment duration. The evaporators were loaded with 10 mg of ZnDPP and 150 mg of $FeCl_3$ and heated to 250° C. and 150° C., respectively. The oCVD ZnDPP coating elaborated from the oCVD reaction of ZnDPP and $FeCl_3$ exhibits a dark green coloration that contrasts with orange coloration of the reference ZnDPP coating elaborated from the sublimation of ZnDPP under the same operating conditions. UV-Vis-NIR spectroscopic analysis of the oCVD ZnDPP coating revealed a broadening and bathochromic shift of the Soret and Q bands, as well as the apparition of a broad absorption in the NIR region up to 2000 nm (FIG. 18). This absorption up to 2000 nm suggests the formation of highly conjugated poly(porphyrins). The LDI-HRMS analysis confirms the formation P(ZnDPP) oligomers with multiple C—C bonds between the ZnDPP units.

Example 12—FeDPP & $FeCl_3$

Figure 19:
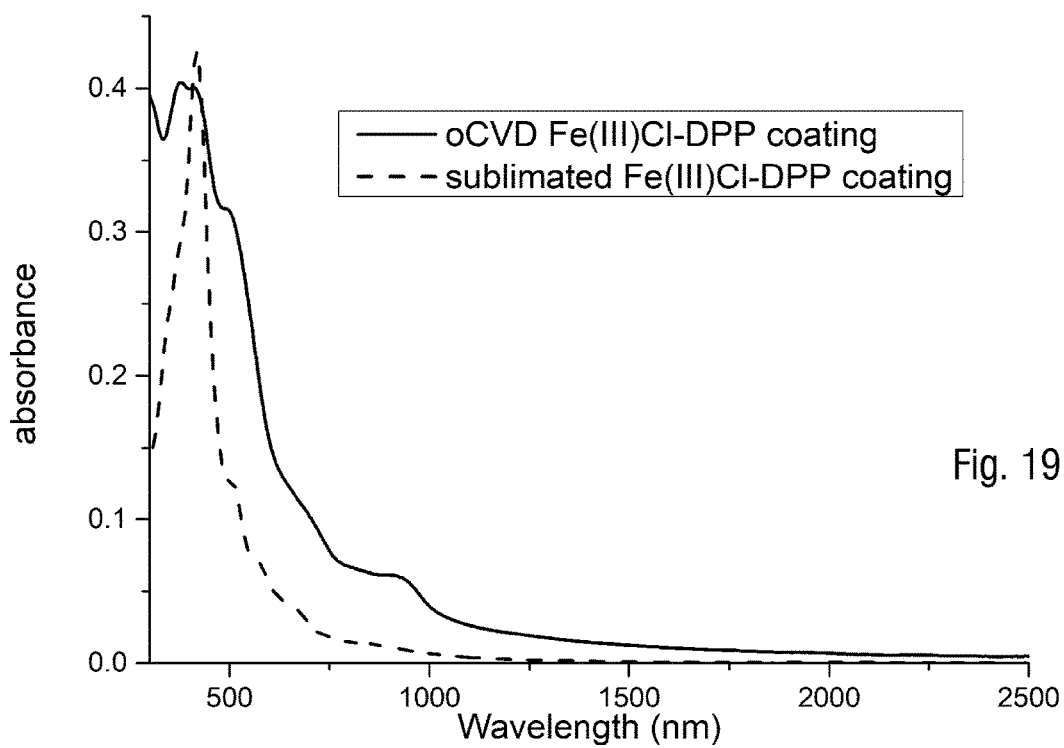
FIG. 19 represents the UV-Vis-NIR absorption spectrum of the P (Fe (III)Cl-DPP) coating obtained from the oCVD reaction of Fe (III)Cl-DPP and $FeCl_3$, in accordance with various embodiments of the invention.

The oxidative chemical vapour deposition reaction of iron (III) 5,15-di(phenyl)porphyrin chloride (Fe (III)Cl-DPP) and iron (III) chloride ($FeCl_3$) was performed in the custom-built oCVD reactor described above. The pressure was $10^{-3}$ mbar and the substrate temperature was 130° C. for all the deposition experiment duration. The evaporators were loaded with 10 mg of Fe (III)Cl-DPP and 150 mg of $FeCl_3$ and heated to 250° C. and 150° C., respectively. The oCVD Fe (III)Cl-DPP coating elaborated from the oCVD reaction of Fe(III)Cl-DPP and $FeCl_3$ exhibits a greenish coloration that contrasts with the orange coloration of the reference Fe(III)Cl-DPP coating elaborated from the sublimation of Fe(III)Cl-DPP under the same operating conditions. UV-Vis-NIR spectroscopic analysis of the oCVD Fe(III)Cl-DPP coating revealed a broadening and bathochromic shift of the Soret and Q bands, as well as the apparition of a broad absorption in the NIR region up to 2000 nm (FIG. 19). This absorption up to 2000 nm suggests the formation of highly conjugated poly(porphyrins). The LDI-HRMS analysis confirms the formation of P(Fe(III)Cl-DPP) oligomers with multiple C—C bonds between the Fe(III)Cl-DPP units.

Example 13—CuDPP & $FeCl_3$

Figure 20:
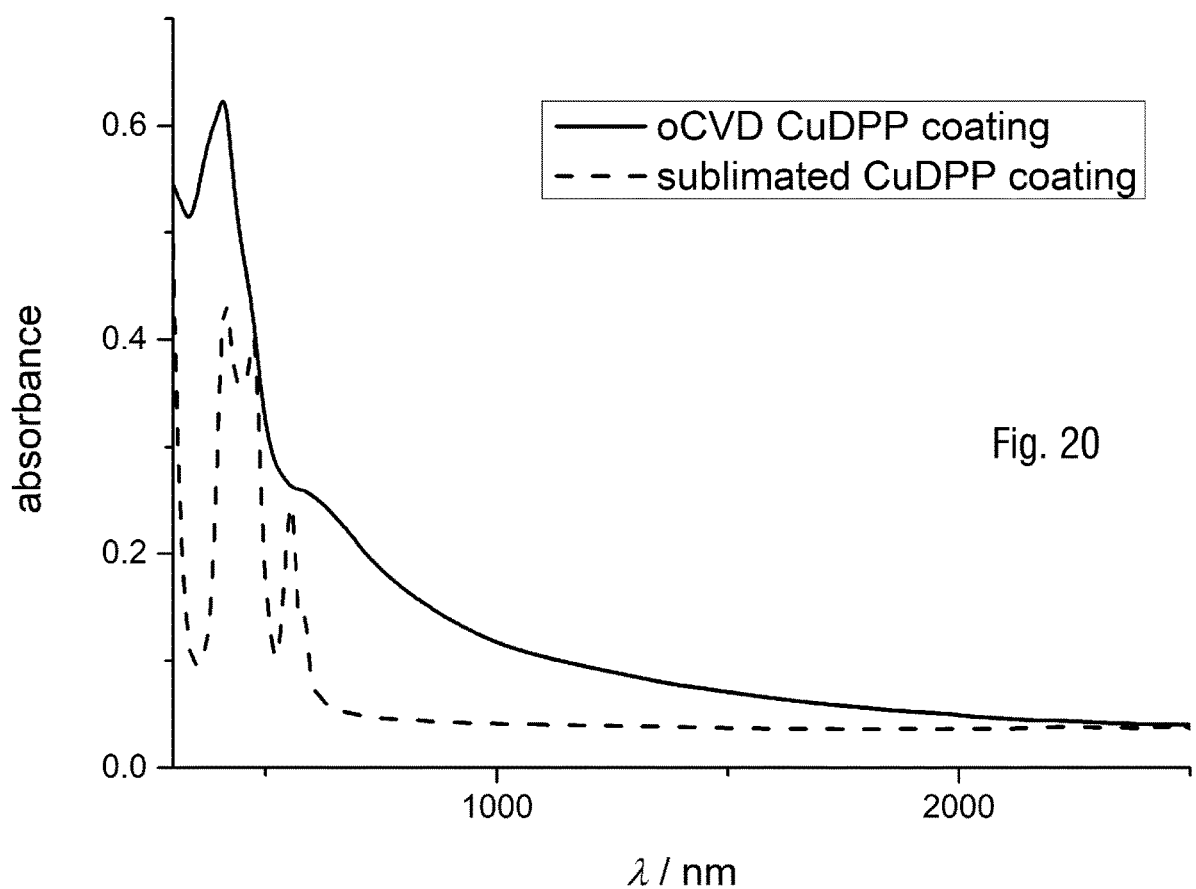
FIG. 20 represents the UV-Vis-NIR absorption spectrum of the P(CuDPP) coating obtained from the oCVD reaction of CuDPP and $FeCl_3$, in accordance with various embodiments of the invention.

The oxidative chemical vapour deposition reaction of copper (II) 5,15-di(phenyl)porphyrin (CuDPP) and iron (III) chloride ($FeCl_3$) was performed in the custom-built oCVD reactor described above. The pressure was $10^{-3}$ mbar and the substrate temperature was 130° C. for all the deposition experiment duration. The evaporators were loaded with 10 mg of CuDPP and 150 mg of $FeCl_3$ and heated to 250° C. and 150° C., respectively. The oCVD CuDPP coating elaborated from the oCVD reaction of CuDPP and $FeCl_3$ exhibits a dark green coloration that contrasts with the orange coloration of the reference CuDPP coating elaborated from the sublimation of CuDPP under the same operating conditions. UV-Vis-NIR spectroscopic analysis of the oCVD CuDPP coating revealed a broadening of the spectrum and bathochromic shift of the Q bands, as well as the apparition of a broad absorption in the NIR region up to 2000 nm (FIG. 20). This absorption up to 2000 nm suggests the formation of highly conjugated poly(porphyrins). The LDI-HRMS analysis confirms the formation P(CuDPP) oligomers with multiple C—C bonds between the CuDPP units.

Example 14—P(NiDPP-co-CoDPP)

Figure 21:
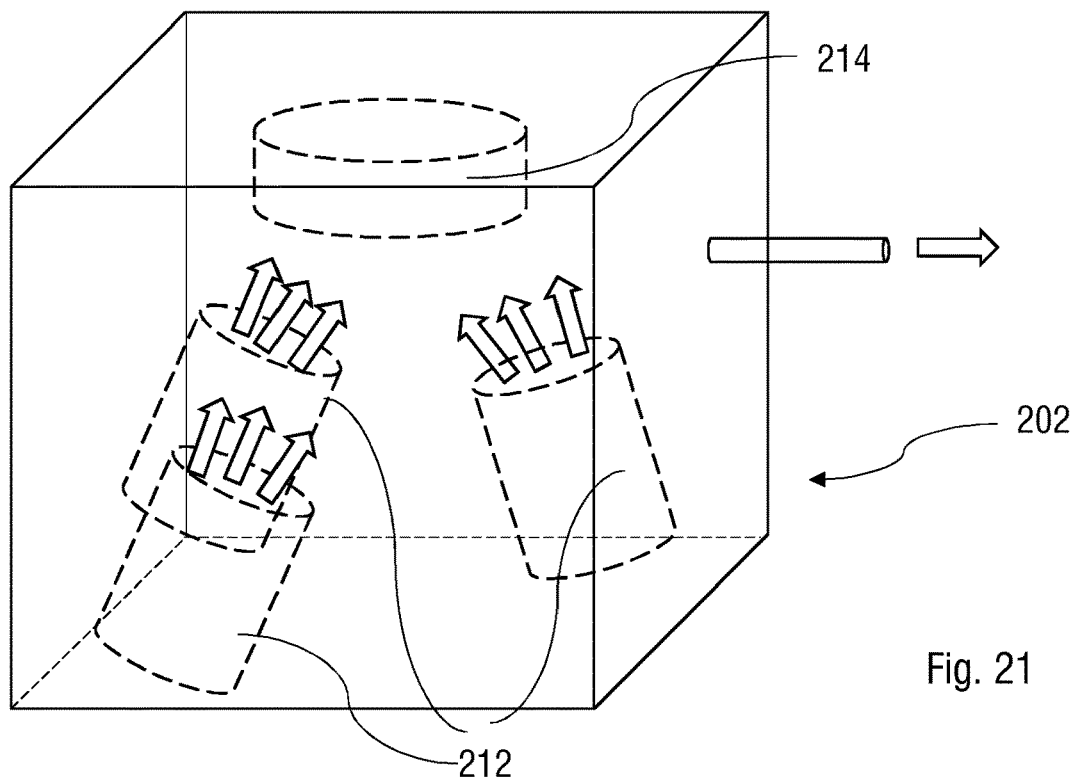
FIG. 21 is a scheme of the oxidative vapour deposition reactor employed for the simultaneous synthesis and deposition of directly fused copoly(porphyrin) coatings from multiple porphyrin monomers, in accordance with various embodiments of the invention.

The oxidative chemical vapour deposition reaction of nickel (II) 5,15-di(phenyl)porphyrin (NiDPP), cobalt (II) 5,15-di(phenyl)porphyrin (CoDPP) and iron (III) chloride ($FeCl_3$) was performed in a custom-built reactor 202 (FIG. 21) equipped with three low temperature evaporation point sources 212 and a dry scroll pump and a turbomolecular pump to achieve high vacuum. The pressure was $10^{-3}$ mbar and the substrate holder 214 was maintained at 130° C. for all the deposition experiment duration. The evaporators 212 were loaded with 10 mg of NiDPP, 10 mg of CoDPP and 150 mg of FeCl$_3$ and heated to 250° C., 250° C. and 170° C., respectively. The oCVD NiDPP/CoDPP coating elaborated from the oCVD reaction of NiDPP and CoDPP with FeCl$_3$ exhibits a dark green coloration that contrasts with the orange coloration of the reference NiDPP/CoDPP coating elaborated from the simultaneous sublimation of NiDPP and CoDPP under the same operating conditions. UV-Vis-NIR spectroscopic analysis of the oCVD NiDPP/CoDPP coating revealed a broadening and bathochromic shift of the Soret and Q band, as well as the apparition of a broad absorption in the NIR region up to 2000 nm. This absorption up to 2000 nm suggests the formation of highly conjugated poly(porphyrins). Hexameric oligomers are observed by mass spectrometry, up to m/z=4000 which corresponds to the instrumental limit. The LDI-HRMS analyses of the oCVD NiDPP/CoDPP coating conclusively revealed the formation of the types of fragments anticipated from covalent bond formation between NiDPP and CoDPP, as well as other fragments formed from the reaction of only NiDPP or only CoDPP. These observations confirm the formation of P(NiDPP-co-CoDPP) polymeric chains. The LDI-HRMS and UV-Vis-NIR analyses confirms the formation of highly conjugated P(NiDPP-co-CoDPP) with multiple C—C bonds between the porphyrin units (LDI-HRMS) and a strong absorption in the NIR region.

Example 15—NiDPP & Cu(ClO$_4$)$_2$

Figure 22:
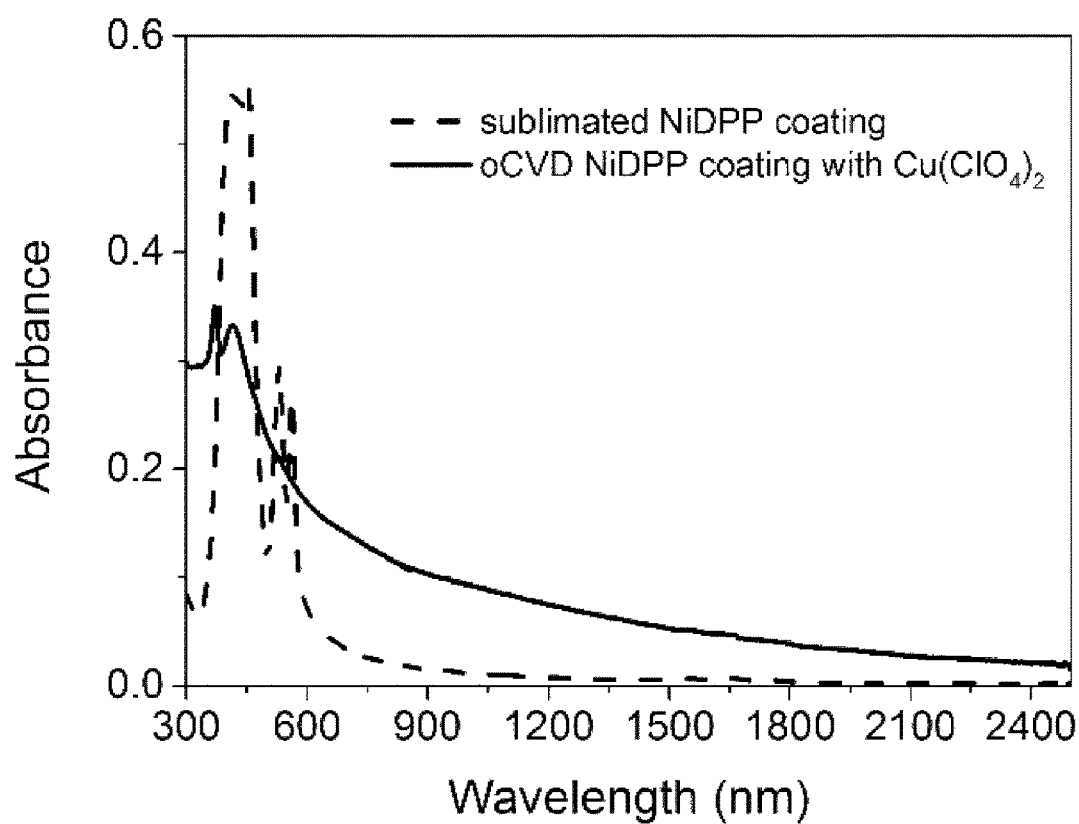
FIG. 22 is the UV-Vis-NIR absorption spectrum of the P(NiDPP) coating obtained from the oCVD reaction of NiDPP and $Cu(ClO_4)_2$, in accordance with various embodiments of the invention.

The oxidative chemical vapour deposition reaction of nickel(II) 5,15-di(phenyl)porphyrin (NiDPP) and copper(II) perchlorate (Cu(ClO$_4$)$_2$) was performed in the custom-built oCVD reactor described above. The pressure was 10$^{-3}$ mbar and the substrate temperature was 130° C. for all the deposition experiment duration. The evaporators were loaded with 10 mg of NiDPP and 300 mg of Cu(ClO$_4$)$_2$ and each one heated to 250° C. The oCVD NiDPP coating elaborated from the oCVD reaction of NiDPP and Cu(ClO$_4$)$_2$ exhibits a dark green coloration that contrasts with the vivid orange coloration of the reference NiDPP coating elaborated from the sublimation of NiDPP under the same operating conditions. Similarly to the UV-Vis-NIR spectra of the oCVD NiDPP coating elaborated from FeCl$_3$, the UV-Vis-NIR spectra of the oCVD NiDPP coating elaborated from Cu(ClO$_4$)$_2$ reveals a broadening and bathochromic shift of the Soret and Q bands, as well as the apparition of a broad absorption in the NIR region up to 2500 nm (FIG. 22). This absorption up to 2000 nm suggests the formation of highly conjugated poly(porphyrins). The LDI-HRMS analysis confirms the formation P(NiDPP) oligomers with multiple C—C bonds between the NiDPP units.

Example 16—NiDPP & CuCl$_2$

Figure 23:
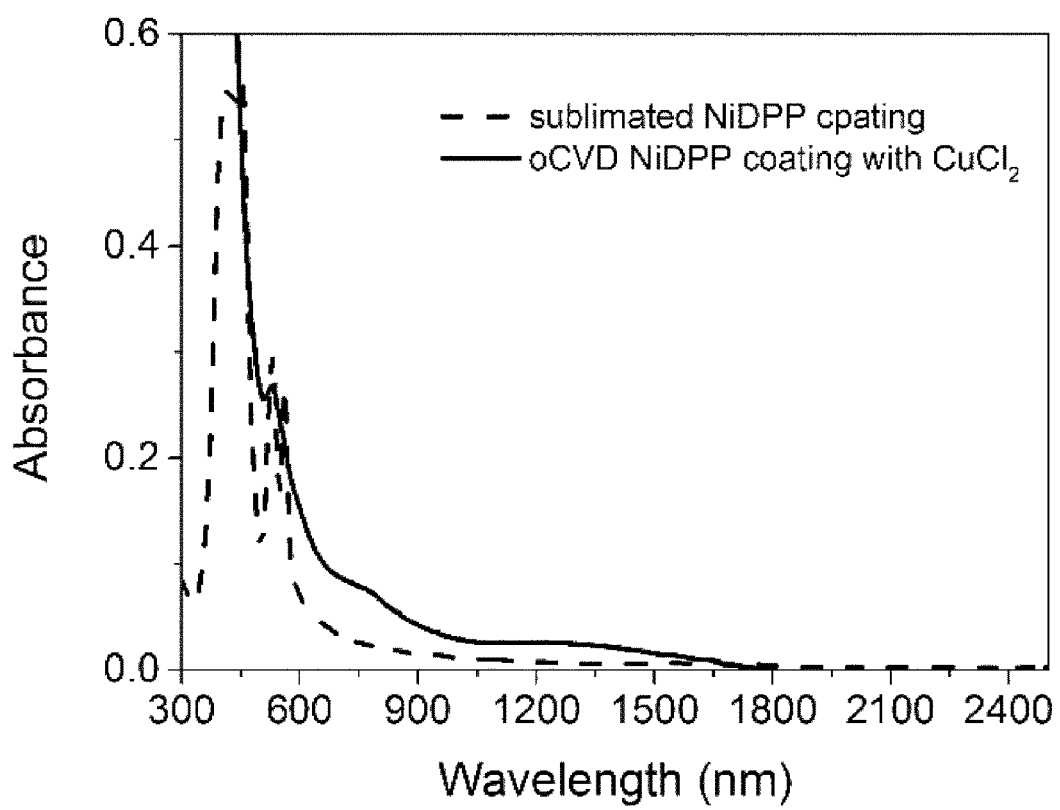
FIG. 23 is the UV-Vis-NIR absorption spectrum of the P(NiDPP) coating obtained from the oCVD reaction of NiDPP and $CuCl_2$, in accordance with various embodiments of the invention.
Figure 24:
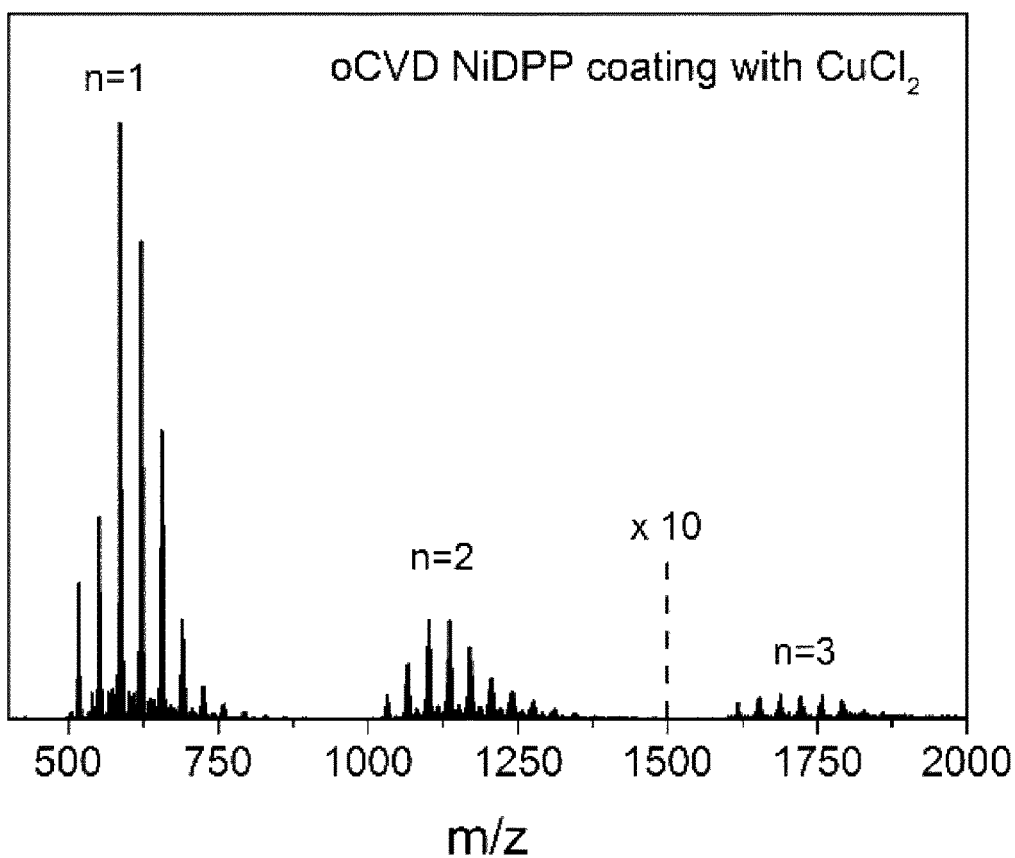
FIG. 24 represents the LDI-HRMS spectra of the P(NiDPP) coating obtained from the oCVD reaction of NiDPP and $CuCl_2$, in accordance with various embodiments of the invention.

The oxidative chemical vapour deposition reaction of nickel (II) 5,15-di(phenyl)porphyrin (NiDPP) and copper (II) chloride (CuCl$_2$) was performed in the custom-built oCVD reactor described above. The pressure was 10$^{-3}$ mbar and the substrate temperature was 130° C. for all the deposition experiment duration. The evaporators were loaded with 10 mg of NiDPP and 250 mg of CuCl$_2$ and heated to 250° C. and 350° C., respectively. The oCVD NiDPP coating elaborated from the oCVD reaction of NiDPP and CuCl$_2$ exhibits a green coloration that contrasts with vivid orange coloration of the reference NiDPP coating elaborated from the sublimation of NiDPP under the same operating conditions. UV-Vis-NIR spectroscopic analysis of the oCVD NiDPP coating revealed a broadening and bathochromic shift of the Soret and Q bands, as well as the apparition of a broad absorption in the NIR region up to 2000 nm (FIG. 23). This absorption up to 1600 nm suggests the formation of highly conjugated poly(porphyrins). The LDI-HRMS analysis confirms the formation of P(NiDPP) oligomers with multiple C—C bonds between the NiDPP units (FIG. 23). An electrical conductivity of the oCVD NiDPP coating was confirmed by a simple resistivity measurement using a multimeter.

Example 17—NiDPP & FeCl$_3$ at 200° C.

Figure 25:
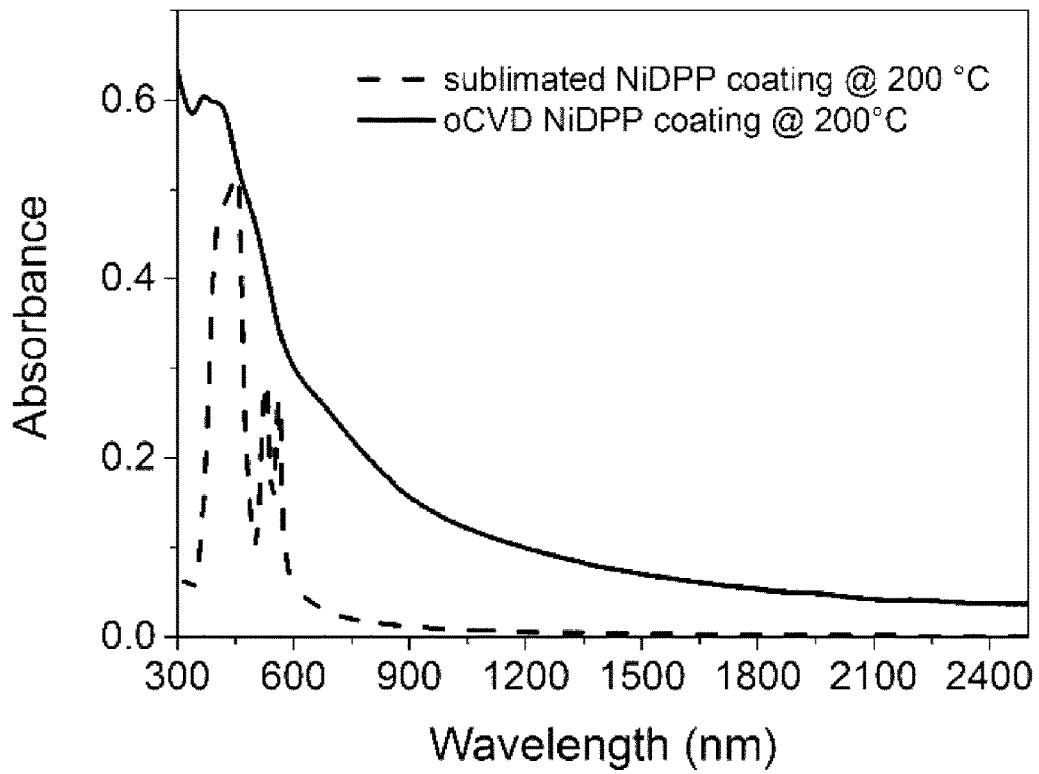
FIG. 25 is the UV-Vis-NIR absorption spectrum of the P(NiDPP) coating obtained from the oCVD reaction of NiDPP and $FeCl_3$ at a substrate temperature of 200° C., in accordance with various embodiments of the invention.
Figure 26:
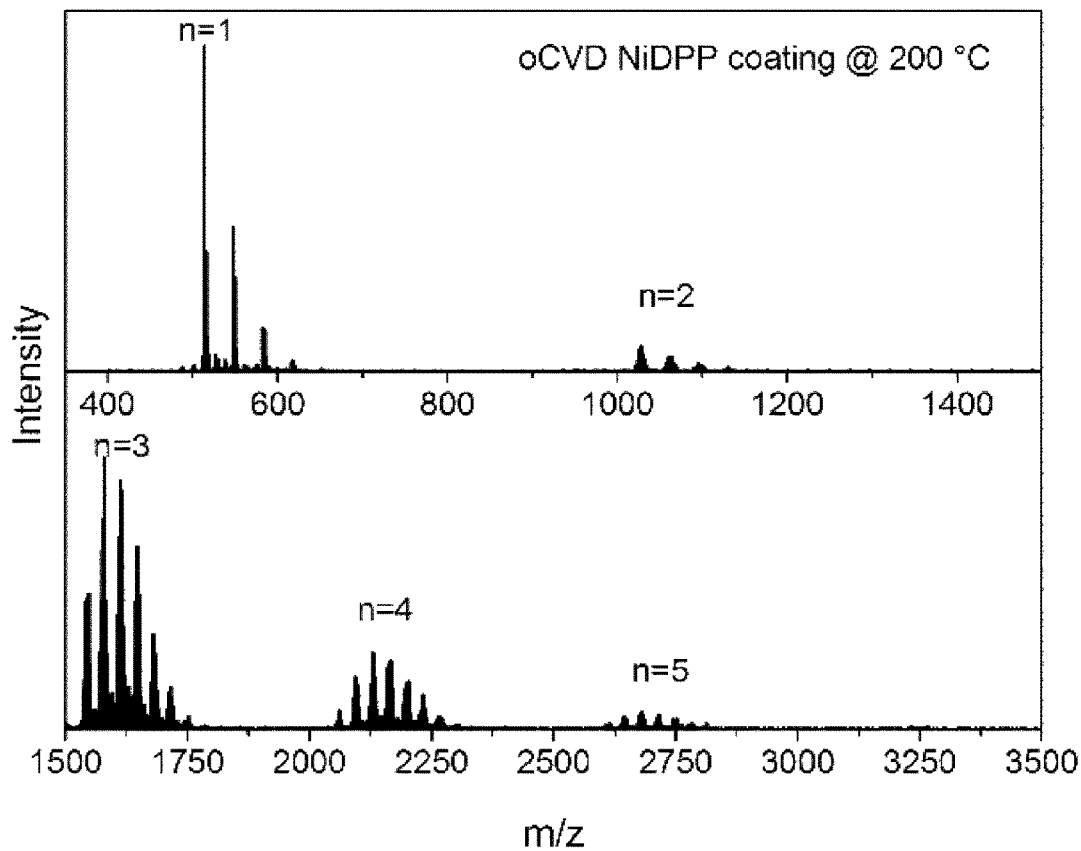
FIG. 26 represents the LDI-HRMS spectra of the P(NiDPP) coating obtained from the oCVD reaction of NiDPP and $FeCl_3$ at a substrate temperature of 200° C., in accordance with various embodiments of the invention.

The oxidative chemical vapour deposition reaction of nickel (II) 5,15-di(phenyl)porphyrin (NiDPP) and iron(III) chloride (FeCl$_3$) was performed in the custom-built oCVD reactor described above. The pressure was 10$^{-3}$ mbar and the substrate temperature was 200° C. for all the deposition experiment duration. The evaporators were loaded with 10 mg of NiDPP and 150 mg of FeCl$_3$ and heated to 250° C. and 150° C., respectively. The oCVD NiDPP coating elaborated from the oCVD reaction of NiDPP and FeCl$_3$ exhibits a brown coloration that contrasts with the vivid orange coloration of the reference NiDPP coating elaborated from the sublimation of NiDPP under the same operating conditions. UV-Vis-NIR spectroscopic analysis of the oCVD NiDPP coating revealed a broadening and bathochromic shift of the Soret and Q bands, as well as the apparition of a broad absorption in the NIR region up to 2500 nm (FIG. 25). This absorption up to 2500 nm suggests the formation of highly conjugated poly(porphyrins). The LDI-HRMS analysis confirms the formation of P(NiDPP) oligomers with multiple C—C bonds between the NiDPP units (FIG. 26). The oCVD NiDPP coating displays an electrical ohmic conductivity with a value of 6.3×10$^{-3}$ S·cm$^{-1}$.

Example 18—NiDPP & FeCl$_3$ at Room Temperature

Figure 27:
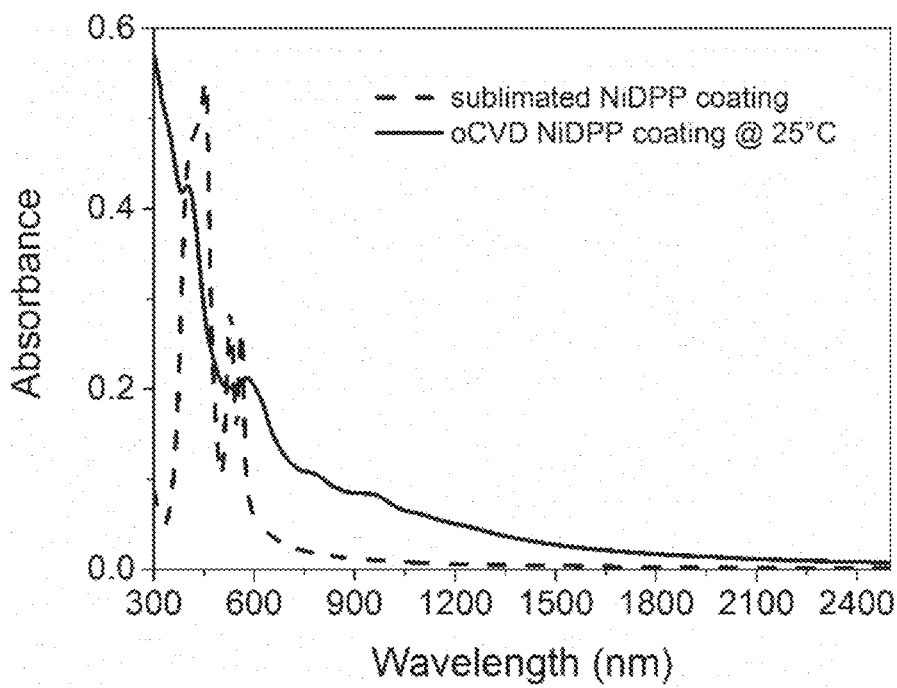
FIG. 27 is the UV-Vis-NIR absorption spectrum of the P(NiDPP) coating obtained from the oCVD reaction of NiDPP and $FeCl_3$ at room temperature (25° C.), in accordance with various embodiments of the invention.
Figure 28:
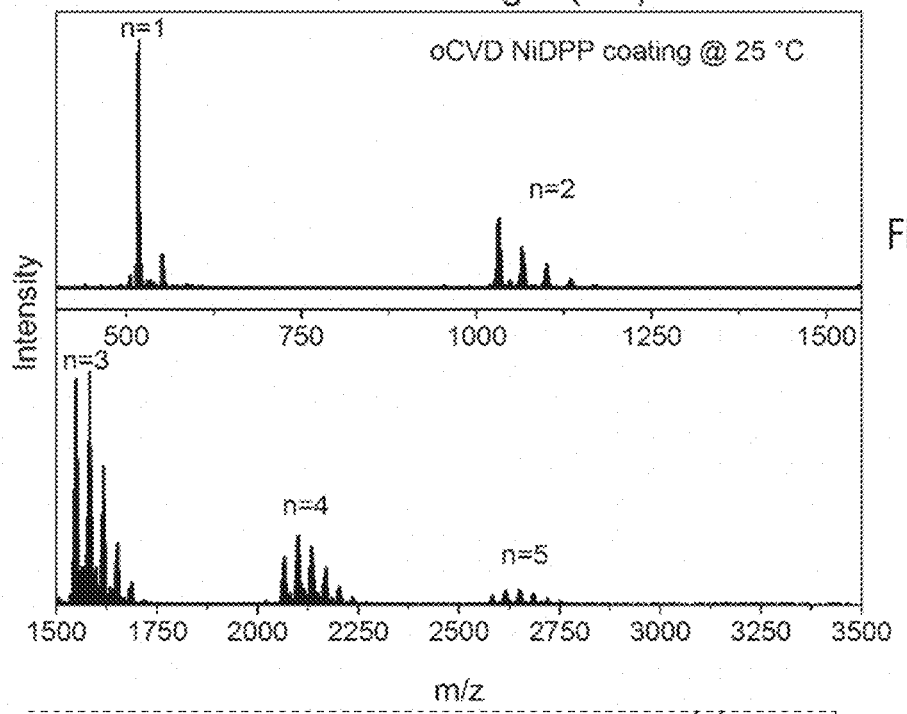
FIG. 28 represents the LDI-HRMS spectra of the P(NiDPP) coating obtained from the oCVD reaction of NiDPP and $FeCl_3$ at room temperature, in accordance with various embodiments of the invention.
Figure 29:
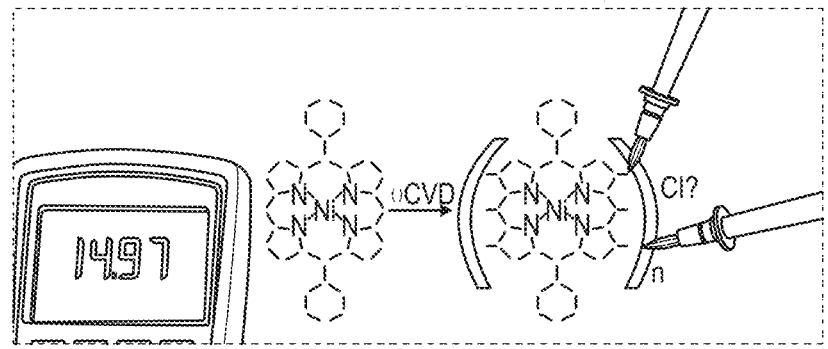
FIG. 29 is a photography of an A4 sheet of printer paper coated by (left) the orange reference NiDPP coating (evaporated) and (right) the dark green poly (NiDPP) coating prepared from the oCVD reaction of NiDPP with $FeCl_3$ using a patterned mask at room temperature, in accordance with various embodiments of the invention.

The oxidative chemical vapour deposition reaction of nickel(II) 5,15-di(phenyl)porphyrin (NiDPP) and iron(III) chloride (FeCl$_3$) was performed in the custom-built oCVD reactor described above. The pressure was 10$^{-3}$ mbar and the substrate was maintained at room temperature (25° C.) during all the deposition experiment duration. The evaporators were loaded with 10 mg of NiDPP and 150 mg of FeCl$_3$ and heated to 250° C. and 150° C., respectively. The oCVD NiDPP coating elaborated from the oCVD reaction of NiDPP and FeCl$_3$ exhibits a green coloration that contrasts with vivid orange coloration of the reference NiDPP coating elaborated from the sublimation of NiDPP under the same operating conditions. UV-Vis-NIR spectroscopic analysis of the oCVD NiDPP coating revealed a broadening and bathochromic shift of the Soret and Q bands, as well as the apparition of a broad absorption in the NIR region up to 2100 nm (FIG. 27). This absorption up to 2000 nm suggests the formation of highly conjugated poly(porphyrins). The LDI-HRMS analysis confirms the formation P(NiDPP) oligomers with multiple C—C bonds between the NiDPP units (FIG. 28). The oCVD NiDPP coating displays an electrical ohmic conductivity with a value of 1.5×10$^{-3}$ S·cm$^{-1}$. The patterned P(NiDPP) coating perfectly resembles the used mask with conductive conjugated poly(porphyrin) lines as thin as one millimeter. Interestingly, electrical conductivity was even observed for the oCVD NiDPP coating deposited on printer paper (FIG. 29).

Example 19—NiTPP

Figure 30:
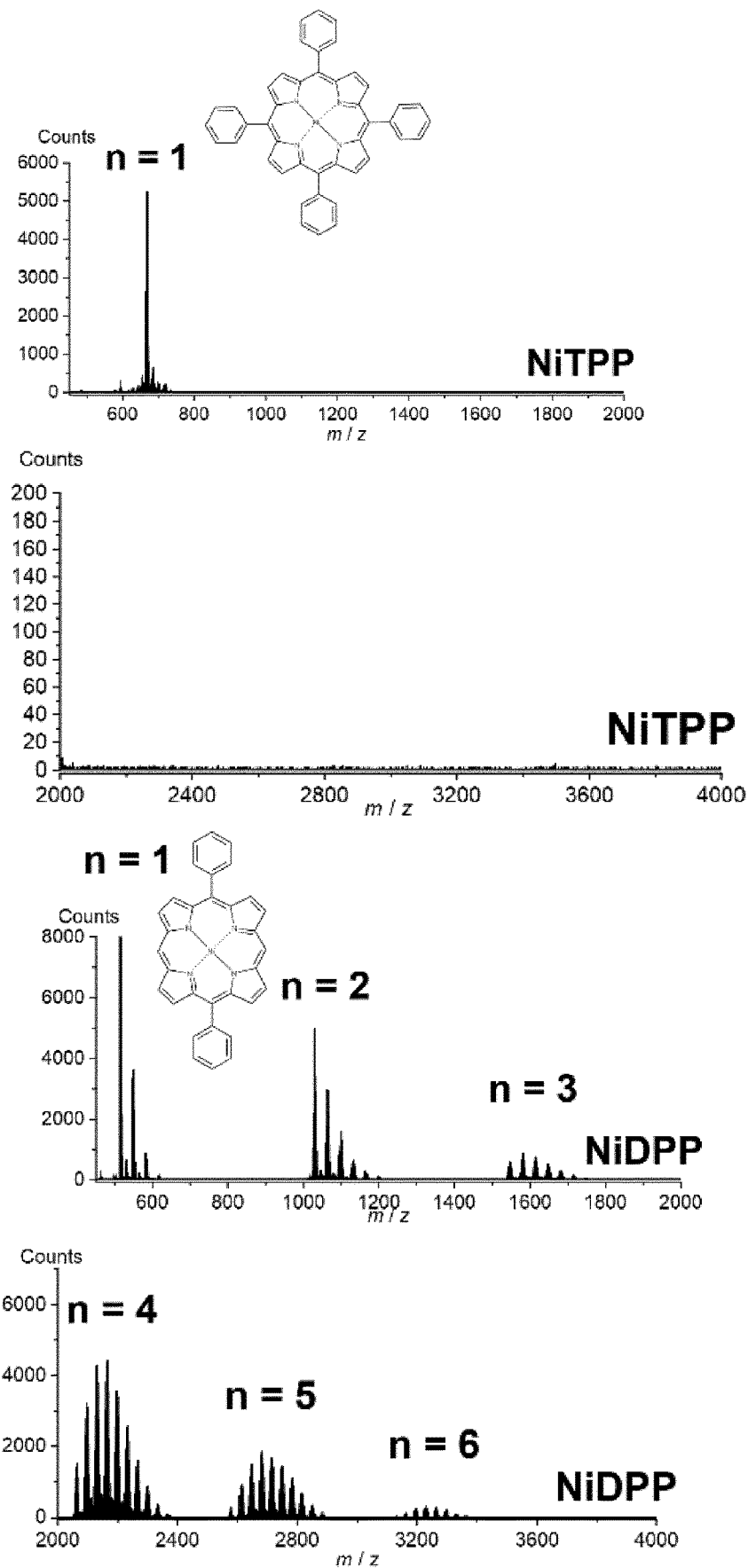
FIG. 30 is an LDI-HRMS spectra of the oCVD coatings obtained from the oCVD reaction of NiTPP (top) and NiDPP (bottom) with FeCl$_3$.

The oxidative chemical vapour deposition reaction of nickel(II) 5,10,15,20-(tetraphenyl)porphyrin (NiTPP) and iron(III) chloride ($FeCl_3$) was performed in the custom-built oCVD reactor described above. The pressure was $10^{-3}$ mbar and the substrate was maintained at 130° C. for all the deposition experiment duration. The evaporators were loaded with 15 mg of NiTPP and 150 mg of $FeCl_3$ and heated to 250° C. and 150° C., respectively. The oCVD NiTPP coating elaborated from the oCVD reaction of NiTPP and $FeCl_3$ exhibits an orangish coloration very similar to the one of the reference NiTPP coating elaborated from the sublimation of NiTPP under the same operating conditions. UV-Vis-NIR spectroscopic analysis of the oCVD NiTPP coating only revealed a slight broadening of the Soret band. No increase of the absorbance at longer wavelength was observed. The LDI-HRMS analysis of the oCVD NiTPP coating solely reveals the presence of monomeric species (FIG. 30). In contrast to the LDI-HRMS analysis of the oCVD NiDPP coating elaborated under the same conditions, which shows the formation P(NiDPP) oligomers with multiple C—C bonds between the NiDPP units, no polymerization of NiTPP units could be evidenced. These observations highlight the unsuitability of NiTPP for the formation of conjugated poly(porphyrin) coatings by oxidative chemical vapour deposition.

Example 20—CrTEPP

Figure 31:
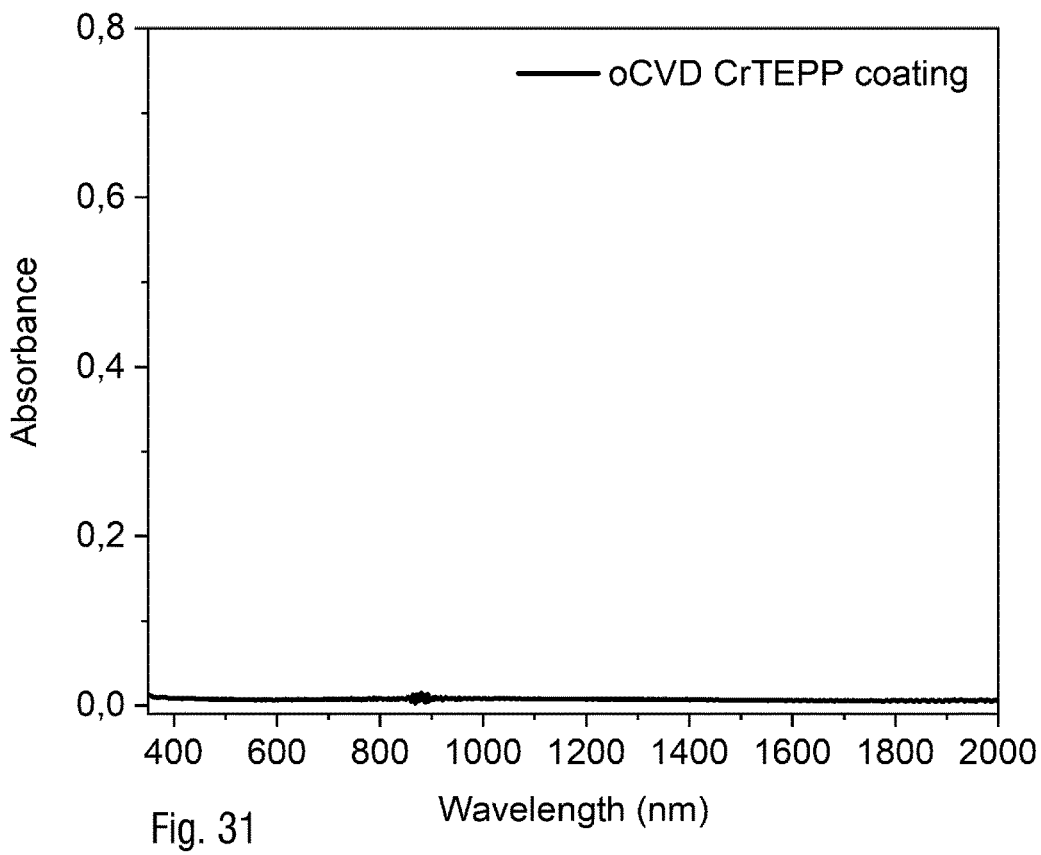
FIG. 31 is a UV-Vis-NIR absorption spectrum of the glass substrate after the oCVD reaction of CrTEPP and FeCl$_3$, in accordance with various embodiments of the invention.

The oxidative chemical vapour deposition reaction of chromium(III) meso-tetra(4-ethynylphenyl)porphine chloride (CrTEPP) and iron(III) chloride ($FeCl_3$) was performed in the custom-built oCVD reactor described above. The pressure was $5\times10^{-4}$ mbar and the substrate was maintained at 100° C. during all the deposition experiment duration. The evaporators were loaded with 50 mg of CrTEPP and 300 mg of $FeCl_3$ and heated to 275° C. and 150° C., respectively. The oCVD reaction of CrTEPP and $FeCl_3$ did not yield any coloration of the glass substrate such as evidenced by UV-Vis-NIR spectroscopic analysis (FIG. 31). The absence of absorption bands related to the CrTEPP monomer or derivatives and the chars formed in the CrTEPP evaporator, due to the thermal decomposition of CrTEPP, highlights the unsuitability of this ethynyl-substituted poprhyrins for the formation of conjugated poly(porphyrin) coatings by oxidative chemical vapour deposition.

Example 21—DEPP

Figure 32:
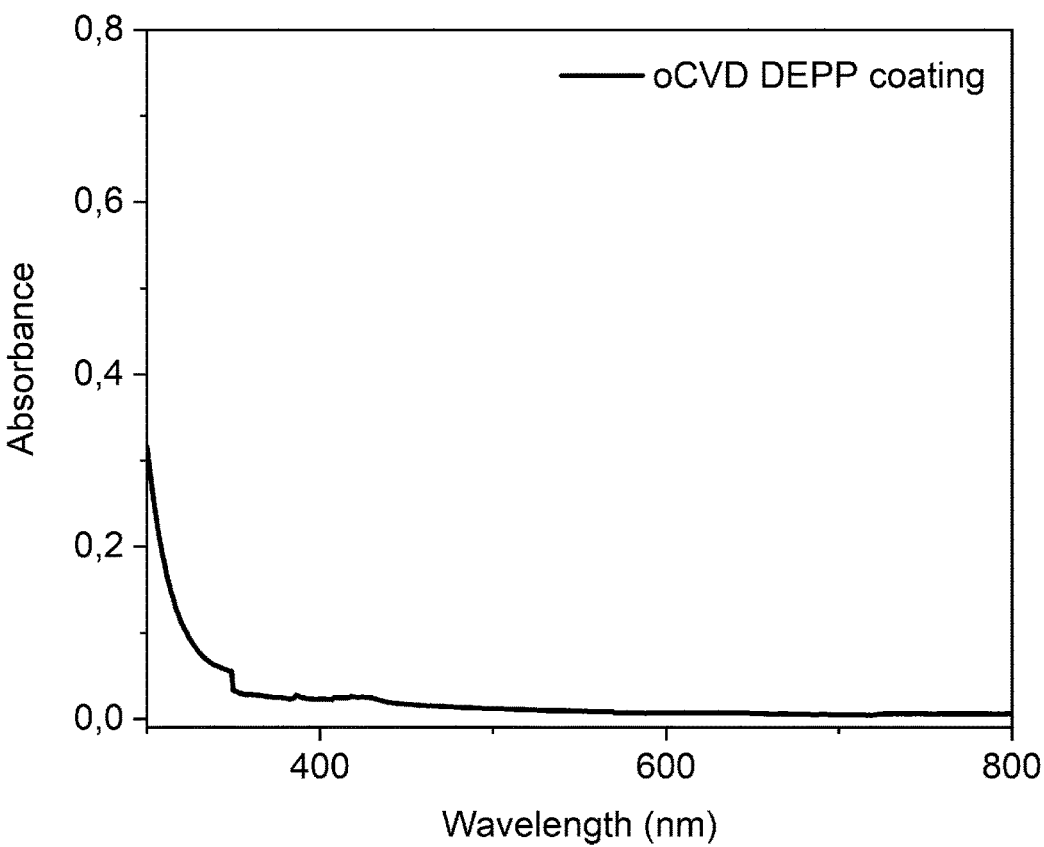
FIG. 32 is the UV-Vis-NIR absorption spectrum of the glass substrate after the oCVD reaction of DEPP and FeCl$_3$, in accordance with various embodiments of the invention.

The oxidative chemical vapour deposition reaction of meso-di(4-ethynylphenyl)porphine chloride (DEPP) and iron(III) chloride ($FeCl_3$) was performed in the custom-built oCVD reactor described above. The pressure was $10^{-3}$ mbar and the substrate was maintained at 100° C. during all the deposition experiment duration. The evaporators were loaded with 50 mg of DEPP and 150 mg of $FeCl_3$ and heated to 250° C. and 150° C., respectively. The oCVD reaction of DEPP and $FeCl_3$ did not yield any coloration of the glass substrate such as evidenced by UV-Vis-NIR spectroscopic analysis (FIG. 32). The absence of absorption bands related to the DEPP monomer or derivatives and the chars formed in the DEPP evaporator, due to the thermal decomposition of DEPP, highlights the unsuitability of this compound for oxidative chemical vapour deposition. These observations highlight the unsuitability of DEPP for the formation of directly fused poly(porphyrin) coatings by oxidative chemical vapour deposition.

The invention claimed is:

1. A conductive coating comprising polymers of meso-meso, β-β doubly linked fused and/or meso-β, β-meso doubly linked fused and/or meso-meso, β-β, β-β triply linked fused (poly)porphyrins, said polymers being represented as:

general formula 1

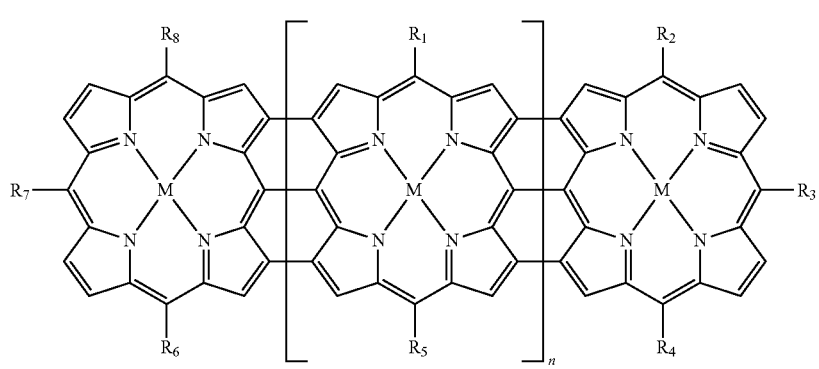

wherein $R_1$-$R_8$ are independently selected from the group: hydrogen, halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group;

wherein M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi, wherein the polymers of general formula 1 comprises n monomers, n is superior to 50 and the monomers being the same or different.

2. The conductive coating according to claim 1, wherein n is superior to 100.

3. The conductive coating according to claim 1, wherein $R_1$-$R_8$ are independently selected from the group: H, phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl and 3,5-di-trifluoromethylphenyl, wherein M is 2H or one metal atoms selected from the group of: Cr, Mn, Fe, Co, Ni, Cu, Zn, Ga, Pd, In and Pt.

4. A method for forming on a substrate a thin conductive coating of polymers of meso-meso, β-β doubly and/or meso-β, β-meso doubly and/or meso-meso, β-β, β-β triply linked fused (poly)porphyrins, the method comprising the steps of:

providing a substrate in a vacuum chamber, performing on said substrate an oxidative chemical vapour deposition reaction with an oxidant and at least one porphyrin monomer of general formula 2:

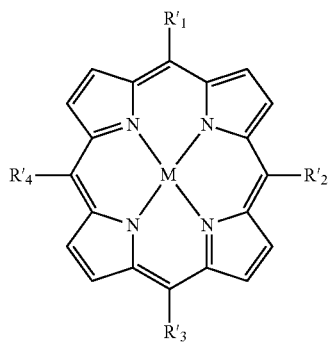

wherein at least two of $R'_1$-$R'_4$ are H, the others being respectively selected independently from the group consisting of: halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group, wherein M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi.

5. The method according to claim 4, wherein the step of performing on said substrate an oxidative chemical vapour deposition reaction with an oxidant and at least one porphyrin monomer of general formula 2 comprises sublimating separately the oxidant and the at least one porphyrin monomer in said vacuum chamber to form gaseous phases respectively and delivering said gaseous phases on the substrate.

6. The method according to claim 4, wherein the step performing on said substrate an oxidative chemical vapour deposition reaction with an oxidant and at least one porphyrin monomer of general formula 2 is further performing with at least one crosslinking monomer being a mono-meso-substituted porphyrin monomer and/or porphine monomer.

7. The method according to claim 4, wherein at least two of $R'_1$-$R'_4$ are H, the others being respectively selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-di-fluorophenyl, 2,6-di-fluorophenyl, pentafluorophenyl, 4-trifluoromethylphenyl and 3,5-di-trifluoromethylphenyl.

8. The method according to claim 4, wherein $R'_1$ and $R'_3$ are H and $R'_2$ and $R'_4$ are both selected from the group consisting of: phenyl, p-tolyl, mesityl, 4-tert-butylphenyl, 3,5-di-tert-butylphenyl, 2,6-di-octyloxyphenyl, 2,6-di-dodecyloxyphenyl, 3,4,5-tri-trimethoxyphenyl, 4-carboxyphenyl, 4-hydroxyphenyl, 3-hydroxyphenyl, 3,5-di-hydroxyphenyl, 4-aminophenyl, 4-pyridyl, 4-bromophenyl, 4-chlorophenyl, 2,6-chlorophenyl, 4-fluorophenyl, 3,5-difluorophenyl, 2,6-di-fluorophenyl, pentafluorophenyl, 4-trifluoromethylphenyl and 3,5-di-trifluoromethylphenyl.

9. The method according to claim 4, wherein the oxidant is selected from the group consisting of: $FeCl_3$, $CuCl_2$ or $Cu(ClO_4)_2$.

10. The method according to claim 4, wherein the step of performing the oxidative chemical vapour deposition reaction is performed at a pressure comprised between $10^{-4}$ mbar to $10^{-2}$ mbar.

11. The method according to claim 5, wherein the oxidant is sublimated at a temperature comprised between 100° C. and 350° C.

12. The method according to claim 5, wherein the at least one porphyrin monomer of general formula 2 is sublimated at a temperature comprised between 200° C. and 300° C.

13. The method according to claim 4, wherein the at least one porphyrin monomer of general formula 2 is a metalized 5,15-(diphenyl)porphyrin (MDPP), wherein M is one metal atoms selected from the group of: Cr, Mn, Fe, Co, Ni, Cu, Zn, Ga, Pd, In, Pt.

14. The method according to claim 4, wherein the oxidant is $FeCl_3$, sublimated between 100° C. and 200° C.

15. The method according to claim 4, wherein the substrate is a polymer, or paper.

16. The method according to claim 4, wherein the substrate is an insulating substrate selecting from the group of: glass, polymer, or paper.

17. A device comprising a substrate and a thin conductive coating of directly fused (poly)porphyrins, wherein said thin conductive coating comprises polymers of meso-meso, β-β doubly linked fused and/or meso-β, β-meso doubly linked fused and/or meso-meso, β-β, β-β triply linked fused (poly)porphyrins, said polymers being represented as:

general formula 1

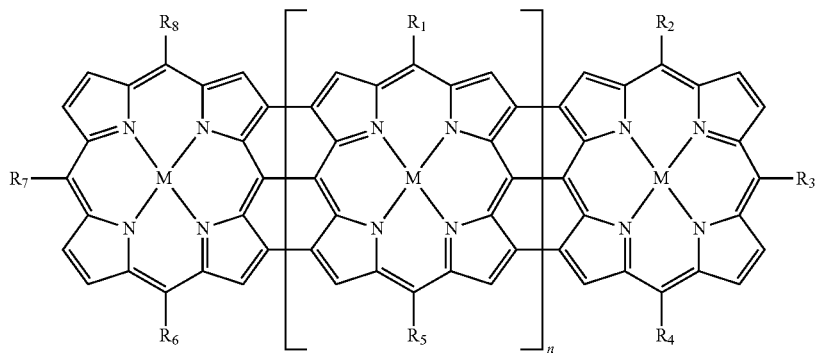

wherein $R_1$-$R_8$ are independently selected from the group: hydrogen, halogen, hydroxyl group, mercapto group, amino group, nitro group, carboxyl group, sulfonic acid group, substituted or non-substituted alkyl group, substituted or non-substituted aryl group, substituted or non-substituted alkoxy group, substituted or non-substituted aryloxy group, substituted or non-substituted alkylthio group, substituted or non-substituted arylthio group, alkylamino group, substituted or non-substituted arylamino group, substituted or non-substituted carboxylate group, substituted or non-substituted carboxylic acid, amino group, substituted or non-substituted sulfonate group, substituted or non-substituted sulfonamide group, substituted or non-substituted carbonyl group, substituted or non-substituted silyl group or substituted or non-substituted siloxy group;

wherein M is 2H or one metal atoms selected from the group of: Cr, Mn, Fe, Co, Ni, Cu, Zn, Ga, Pd, In, Pt, Sc, Y, Eu, Er, Yb, Ti, V, Nb, Ta, U, Mo, W, Ru, Os, Rh, Ir, Ag, Au, Cd, Hg, Ti, Sn, Pb, As, Sb, and Bi, wherein the polymers of general formula 1 comprises n monomers, n is superior to 50 and the monomers being the same or different.

18. the method according to claim 15, wherein the polymer is polyethylene naphthalate and the paper is printer paper sheet.

* * * * *